United States Patent [19]

Hansen et al.

[11] Patent Number: 5,185,686
[45] Date of Patent: Feb. 9, 1993

[54] DIRECTION SENSING ARC DETECTION

[75] Inventors: James E. Hansen, Oak Creek; Bruce C. Beihoff, Wauwatosa; Charles J. Tennies, Waukesha; Francis S. Richards, Jr., Germantown, all of Wis.

[73] Assignee: Eaton Corporation, Cleveland, Ohio

[21] Appl. No.: 676,840

[22] Filed: Mar. 28, 1991

[51] Int. Cl.⁵ .................. H02H 3/32; G01R 31/08
[52] U.S. Cl. ............................... 361/45; 361/87; 361/93; 361/111; 324/522; 324/536
[58] Field of Search ............ 361/5, 45, 46, 49, 50, 361/57, 63, 65, 67, 82, 84, 87, 91, 93, 111; 324/522, 529, 530, 536, 537, 541, 544

[56] References Cited

U.S. PATENT DOCUMENTS

| H536 | 10/1988 | Strickland | 324/456 |
|---|---|---|---|
| Re. 30,678 | 7/1981 | Van Zeeland et al. | 361/44 |
| 2,808,566 | 10/1957 | Douma | 324/127 |
| 3,471,784 | 10/1969 | Arndt et al. | 324/126 |
| 3,588,611 | 6/1971 | Lambden et al. | 324/536 |
| 3,622,872 | 11/1971 | Boaz | 324/52 |
| 3,746,930 | 7/1973 | Van Best et al. | 317/31 |
| 3,775,675 | 11/1973 | Freeze et al. | 324/51 |
| 3,869,665 | 3/1975 | Kenmochi et al. | 324/72 |
| 3,878,460 | 4/1975 | Nimmersjo | 324/52 |
| 3,911,323 | 10/1975 | Wilson et al. | 317/18 R |
| 3,914,667 | 10/1975 | Waldron | 317/36 TD |
| 4,169,260 | 9/1979 | Bayer | 340/562 |
| 4,214,210 | 7/1980 | O'Shea | 455/282 |
| 4,245,187 | 1/1981 | Wagner et al. | 324/54 |
| 4,316,187 | 2/1982 | Spencer | 340/664 |
| 4,387,336 | 6/1983 | Joy et al. | 324/51 |
| 4,466,071 | 8/1984 | Russell, Jr. | 364/492 |
| 4,639,817 | 1/1987 | Cooper et al. | 361/62 |
| 4,644,439 | 2/1987 | Taarning | 361/87 |
| 4,697,218 | 9/1987 | Nicolas | 361/87 |
| 4,771,355 | 9/1988 | Emery et al. | 361/33 |
| 4,810,954 | 3/1989 | Fam | 324/142 |
| 4,853,818 | 8/1989 | Emery et al. | 361/33 |
| 4,858,054 | 8/1989 | Franklin | 361/57 |
| 4,922,368 | 5/1990 | Johns | 361/62 |
| 4,931,894 | 6/1990 | Legatti | 361/45 |
| 4,949,214 | 8/1990 | Spencer . | |
| 5,121,282 | 6/1992 | White | 361/42 |

OTHER PUBLICATIONS

"Feasibility of Main Service Ground-Fault Protection on the Electrical Service to Dwelling Units", Consultants Electro-Protection, Inc., Laval, Quebec, for the Canadian Electrical Association, Oct. 1990.

"Detection of Arcing Faults on Distribution Feeders", Electric Power Research Institute, EPRI EL-2757, Dec. 1982.

"Direction Coupler Design Graphs", Alejandro Duenas J., RF Design, Feb. 1986, pp. 62-64.

"Direction Couplers", Antonio N. Paolantonio, RF Design, Sep./Oct. 1979, pp. 40-49.

Primary Examiner—Emanuel T. Voeltz
Assistant Examiner—Adolf Berhane
Attorney, Agent, or Firm—Andrus, Sceales, Starke & Sawall

[57] ABSTRACT

An arc detection method and apparatus is provided for an electric circuit having an electrified conductor (46) connecting a voltage source (26) to a load (30), the conductor having a line side extending from the arc detector to the voltage source, and a load side extending from the arc detector to the load. The arc detector includes a field sensor (62) sensing the electromagnetic field established about the conductor by the occurrence of an electrical arc in the circuit, and generating a field responsive signal in response thereto. Direction sensing circuitry detects whether the arc is from the load side or the line side, and generates a direction indicative signal.

18 Claims, 14 Drawing Sheets

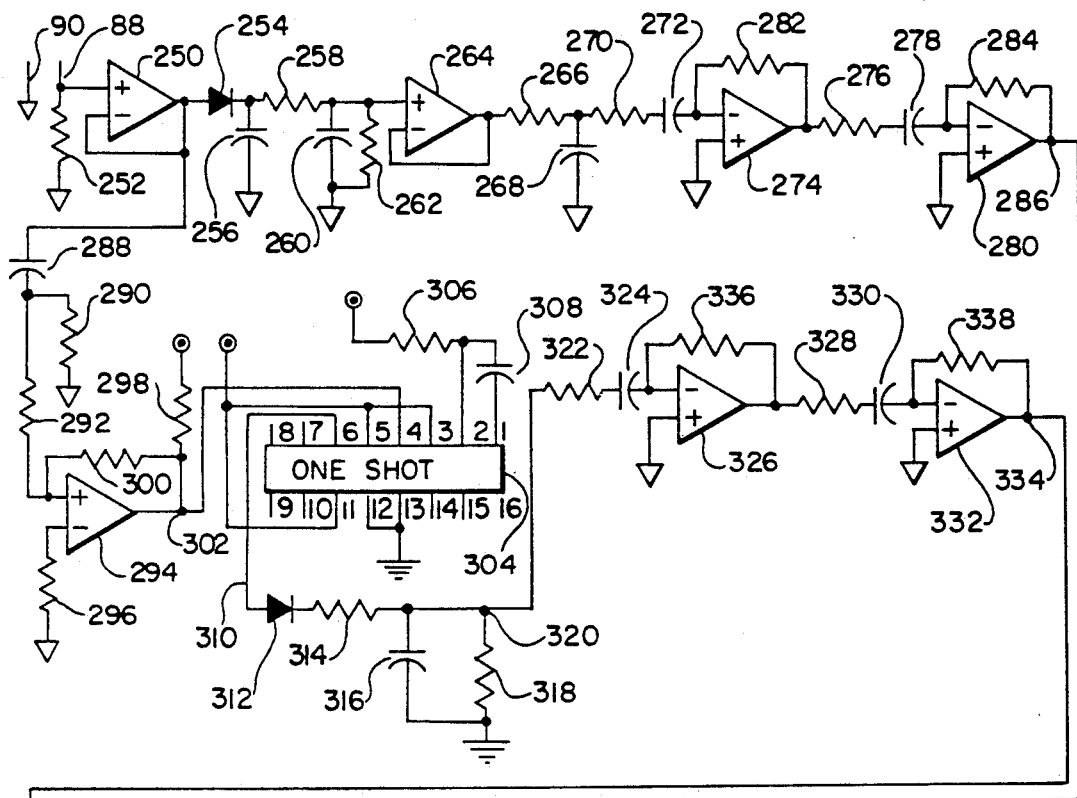
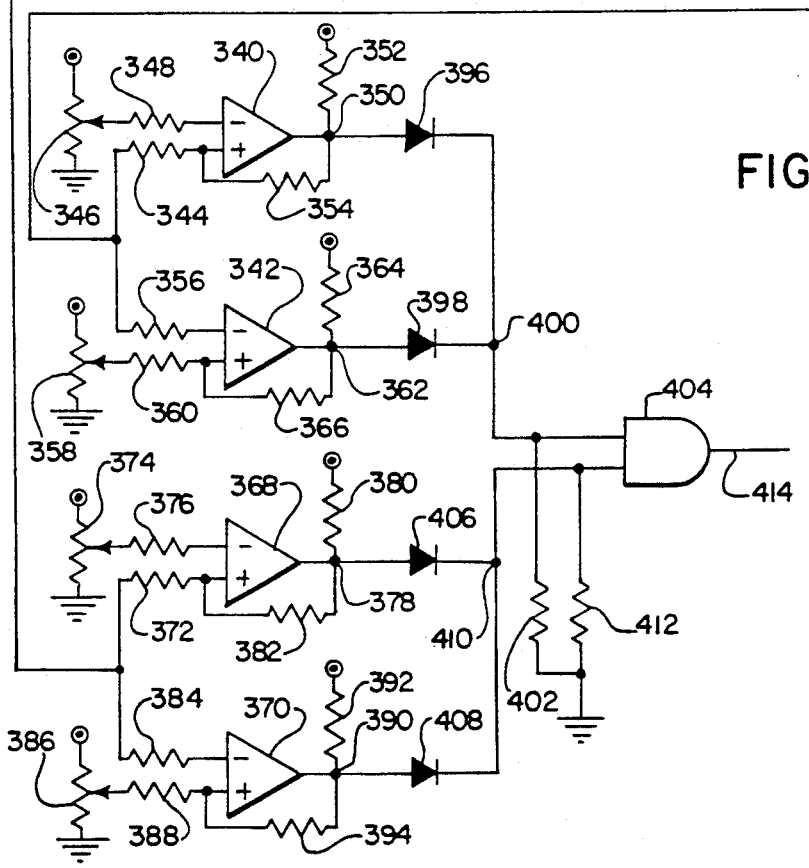
FIG. 7

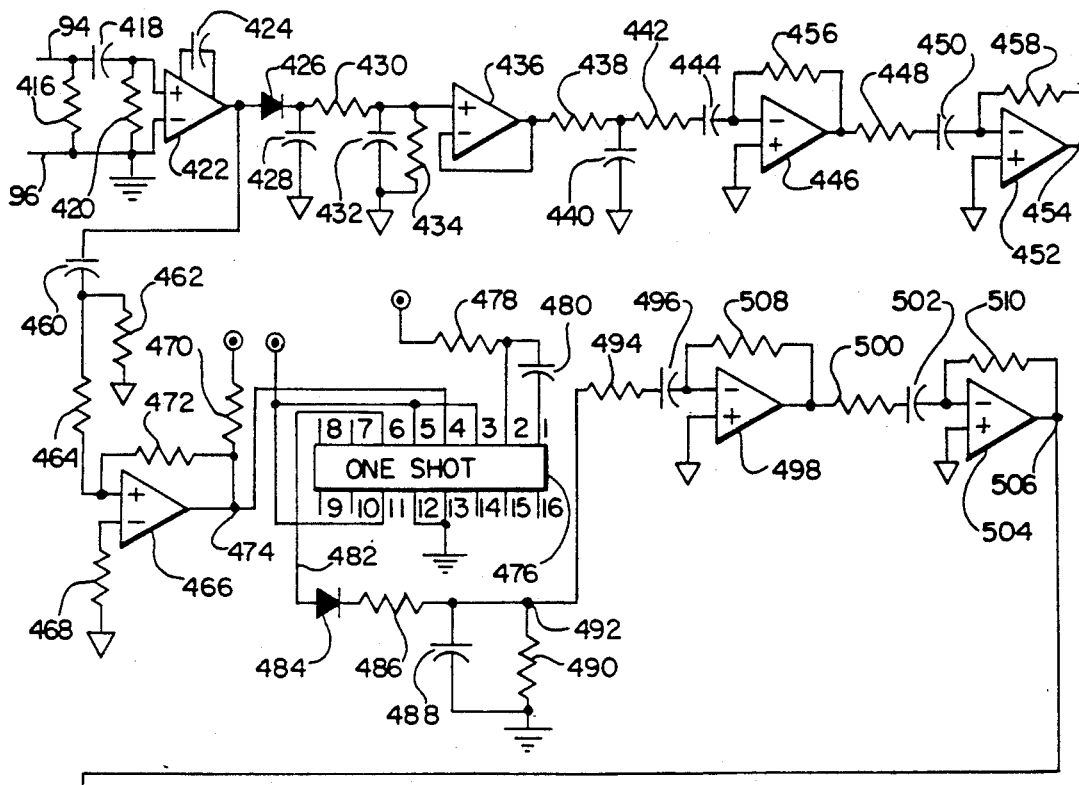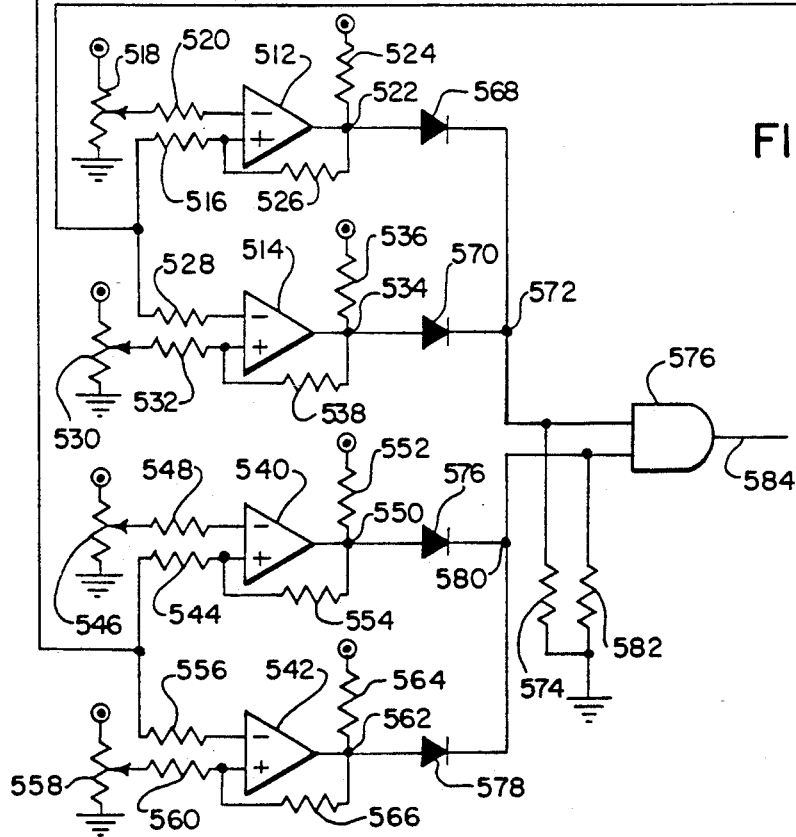
FIG. 8

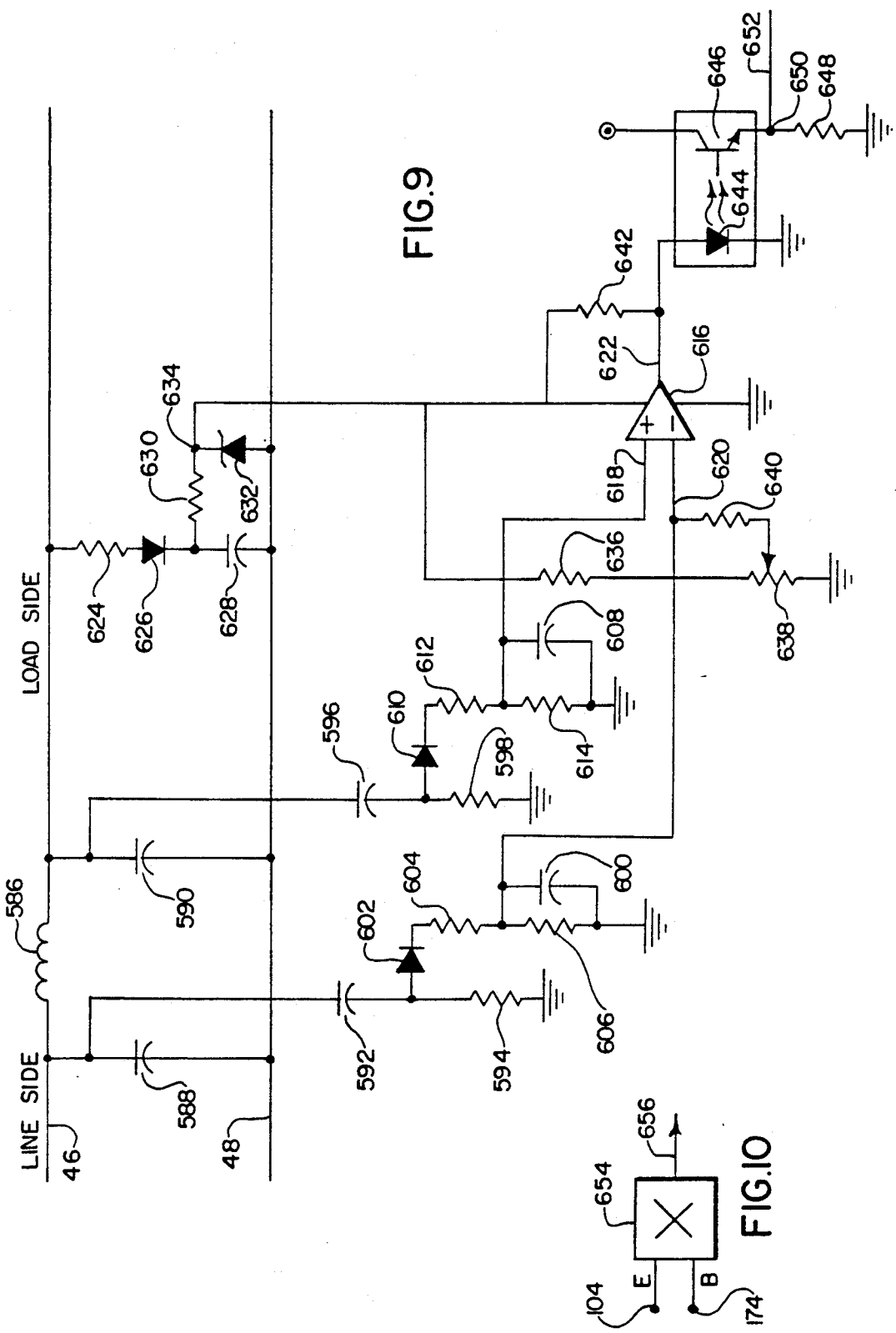

FIG. 18
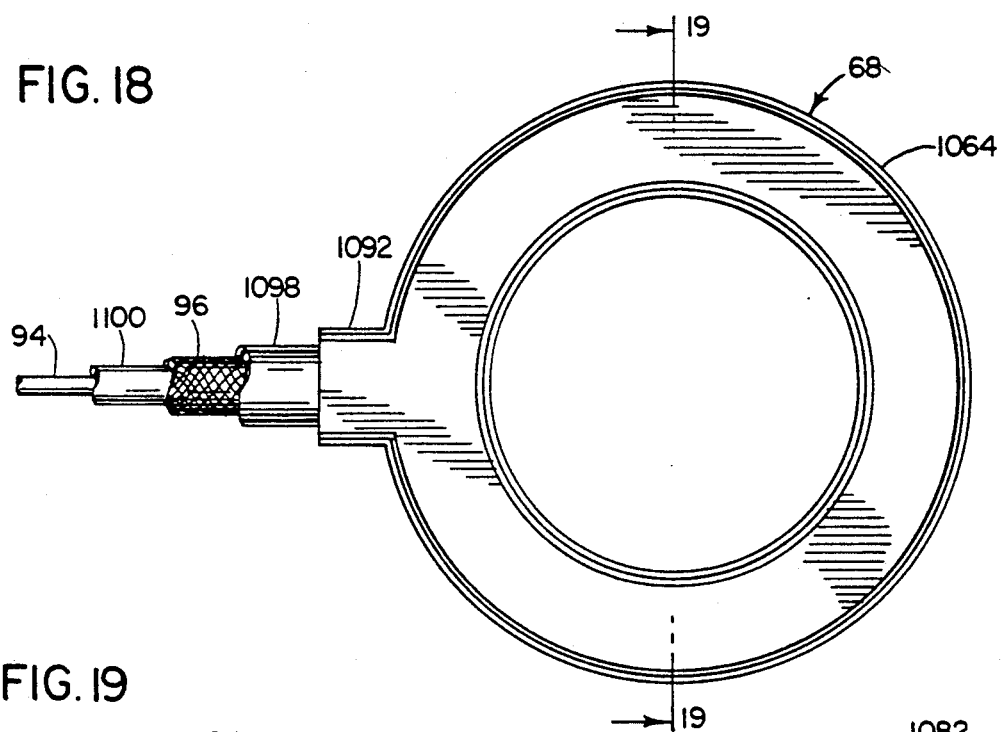
FIG. 19
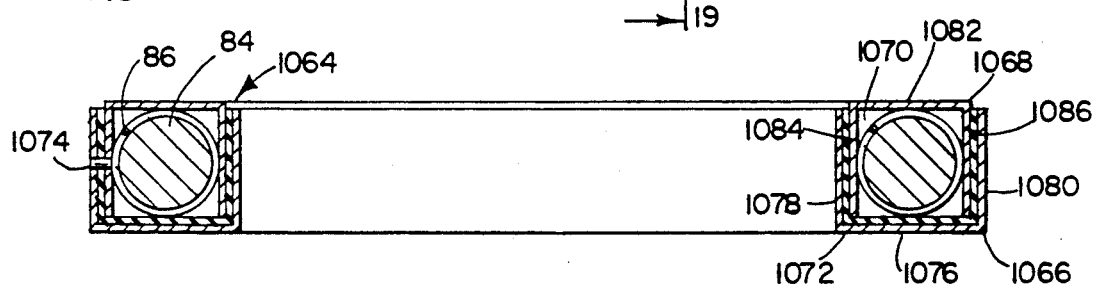
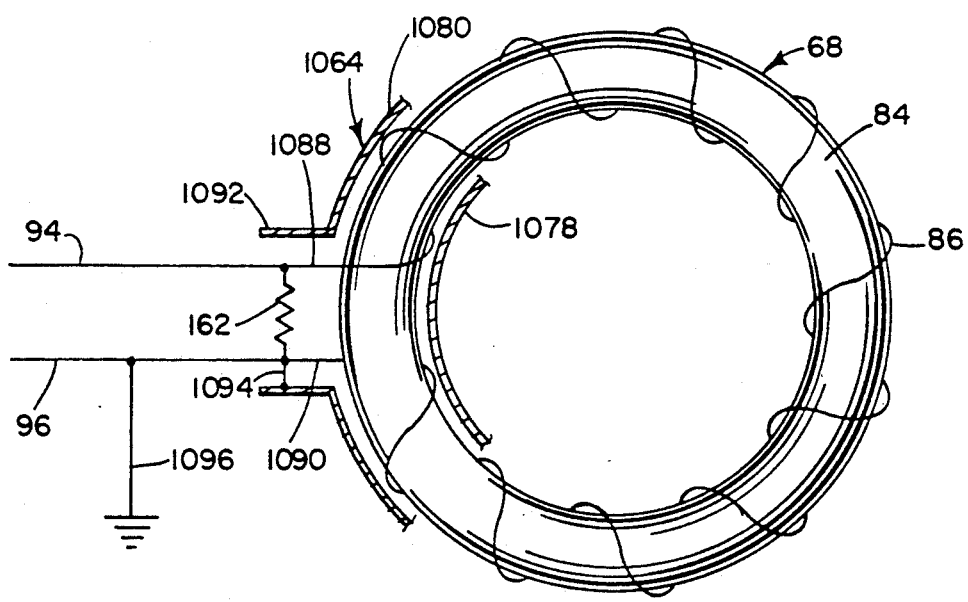
FIG. 20

DIRECTION SENSING ARC DETECTION

FIELD OF THE INVENTION

The invention relates to protection techniques for electric circuits, and more particularly to the detection of arcs which are too small to trip a circuit breaker or the like.

This application is related to commonly assigned copending U.S. Pat. applications Ser. No. 07/676741 Mar. 28, 1991 entitled "Field sensing arc detector transducer", Ser. No. 07/676739 filed Mar. 28, 1991 entitled "Chaos sensing arc detection", Ser. No. 07/676742 filed Mar. 28, 1991 entitled "Timing Window arc detection", Ser. No. 07/676738 filed Mar. 28, 1991 entitled "Frequency Selective arc detection" and Ser. No. 07/676781 filed Mar. 28, 1991 entitled "Arc detector transducer".

BACKGROUND

The invention arose during continuing development efforts in electric circuit protection techniques, including residential, commercial and industrial applications having overcurrent protection systems for preventing personal injury and property damage. Such overcurrent protection systems typically include a load center or panelboard receiving electrical power from the utility company transformer, and routing the electrical power through a main circuit breaker or fuse and then through branch circuit breakers or fuses to designated branch circuits, each supplying current to one or more electrical loads. The circuit breakers or fuses are designed to interrupt the electrical current if it is excessive or outside the design limits of the conductor and loads, to reduce the risk of injury and damage, including fires. Circuit breakers are more commonly preferred because they are reusable simply by resetting same.

A circuit breaker has a thermal/magnetic trip characteristic. The thermal characteristic is operative in response to overload current of extended duration which heats a bimetal member, causing movement of the latter, which in turn releases a latch to trip open a set of contacts. For example, the thermal characteristic would respond to 30 amps being drawn in a 15 amp circuit. The magnetic characteristic is operative in response to a sudden high magnitude current overload condition, and uses the magnetic field generated in a magnetic core to attract an armature, which movement releases the latch to open the contacts. As an example, the magnetic type actuation occurs in response to a short circuit wherein the hot line conductor becomes directly connected with ground or neutral, bypassing the load.

A further type of circuit protection is provided by ground fault interrupters, which trip the breaker to an open circuit condition in response to an imbalance of currents between the line and neutral conductors of a given circuit. This is particularly desirable in the event that a person is the path to ground.

The present invention addresses a further type of electric circuit protection and monitoring, namely the detection of arcing in the electric circuit. The arcs to be monitored include high impedance faults or other intended or unintended circuit paths which do not have sufficient energy or current flow to jump a gap or trip a breaker, but nevertheless can generate damaging heat or other undesirable effects. An arc may occur in series or parallel with the load, and may have numerous causes, for example loose connections, worn or aged wiring or insulation, prior electrical stressing such as caused by overuse, prior lightning strikes, etc. The current in such arcs may be below the thermal and magnetic trip settings of the breaker or a fuse, and/or may not present an imbalance of currents between the line and neutral conductors, and hence such arcs can go undetected. A particular hazard due to arcing is hot spots along electrical wiring in a residence or the like, which is a fire risk.

SUMMARY

The present invention provides a direction sensing arc detection method and apparatus for an electric circuit having an electrified conductor connecting a voltage source to a load, wherein the conductor has a line side extending from the arc detector to the voltage source, and a load side extending from the arc detector to the load. The invention has particularly desirable application to electric current distribution circuits having a voltage source of predetermined excitation frequency serially coupled to a load and an electroresponsive circuit breaker by an electrified conductor. In the latter application, the circuit breaker is tripped to an open circuit condition in response to a given characteristic of an arc indicative signal. The invention has other applications, including aircraft current distribution systems, including DC systems, personal safety devices carried on the belt of an individual, and specialized wiring requirements such as in hospitals. The invention also may be used in monitoring and diagnostic applications for generating an arc indicative signal which can be monitored and used in a preventative manner before the arc reaches a level considered to be a fault. The invention may also be used for monitoring AC and DC electric motors and circuit health, including rotors, stators, solid state power semiconductors, slip rings, commutators, etc., in drives, starters, and controls.

The system detects an electromagnetic field established about the conductor by the occurrence of an electrical arc in the electric circuit, and generates a field responsive signal in response thereto. The system detects whether the arc is from the load side or the line side, and generates a direction indicative signal. In a breaker application, the breaker is tripped only if the arc is from the load side. This prevents breaker tripping due to upstream arcs which may be occurring in a neighbor's house and creating a noise signal which is transmitted through the utility company's line.

BRIEF DESCRIPTION OF THE DRAWINGS

FIG. 7 is circuit diagram showing an E field amplitude and frequency chaos detection circuit.

FIG. 8 is a circuit diagram showing a B field amplitude and frequency chaos detection circuit.

FIG. 9 is a circuit diagram of a direction sensitive circuit.

FIG. 10 shows another circuit for direction sensing.

FIG. 18 shows a further embodiment of the B field sensor of FIG. 3.

FIG. 19 is a sectional view taken along line 19—19 of FIG. 18.

FIG. 20 shows the electrical connections for the sensor of FIG. 18.

DETAILED DESCRIPTION

Figure 1:
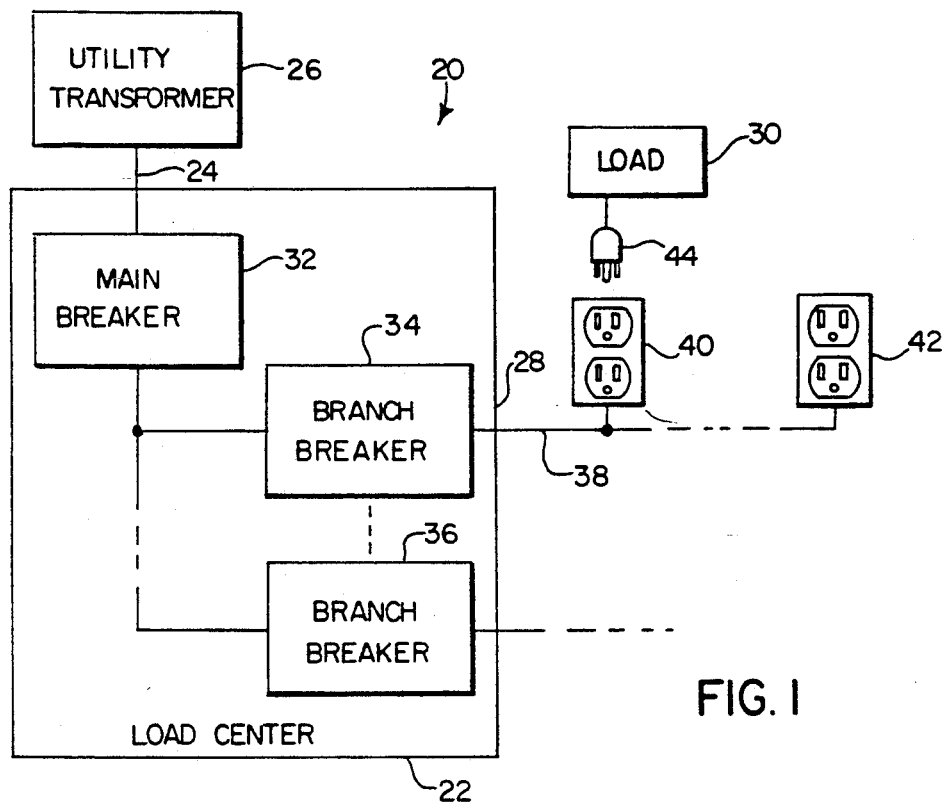
FIG. 1 is a schematic illustration of an electrical current distribution circuit.

FIG. 1 shows an electrical current distribution circuit 20 including a load center 22 having a line side 24 for receiving electrical power from a voltage source 26 of predetermined excitation frequency, and a load side 28 distributing the electrical power to loads such as 30. The voltage source is the power utility company transformer supplying electrical power on first and second line conductors and a neutral conductor at 240 volts and 120 volts at 60 Hz. The load center has a main electro-responsive circuit breaker 32 receiving the electrical power from transformer 26 and distributing the electrical power to branch circuit breakers 34, 36, etc. The branch circuit breakers in turn supply the electrical power on branch conduits such as 38 to electrical outlets 40, 42, etc. into which load 30 is plugged at plug 44, or branch conduit 38 is wired directly to a load. Branch conduit 38 includes a line conductor 46, FIG. 2, and a neutral conductor 48 supplying the electrical power to load 30. Branch conduit 38 also includes a ground conductor 50. Circuit breaker 34 includes an overload trip mechanism 52 having a thermal/magnetic characteristic tripping breaker contacts 54 to an open circuit condition in response to a given circuit overload condition, to disconnect load 30 from the voltage source 26, as is known in the prior art. It is also known in the prior art to provide circuit breaker 34 with ground fault interrupter circuitry 56 responding to a line or neutral to ground fault to gate SCR 58 into conduction to in turn energize coil 60 which opens breaker contacts 54.

Figure 2:
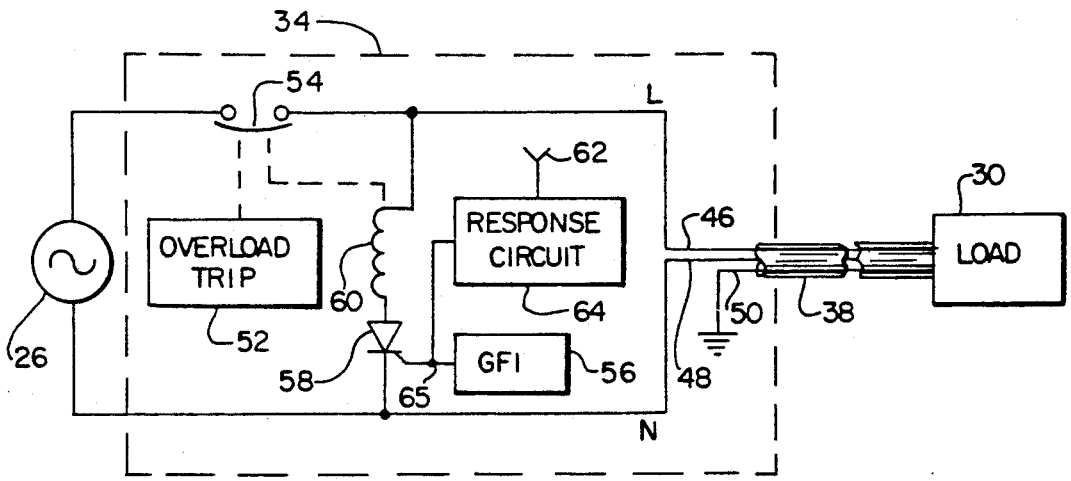
FIG. 2 is a schematic illustration of a portion of the circuit of FIG. 1.

The present invention provides an arc detector and transducer for an electric circuit including an electrified conductor 46, FIG. 2, connecting a voltage source 26 to a load 30. An antenna transducer 62 is disposed adjacent conductor 46 and provides a field sensor operative to detect the electromagnetic field established about conductor 46 by the occurrence of an electrical arc in the electric circuit, and generates a field responsive signal in response thereto. A response circuit 64 includes an arc discrimination circuit for discriminating between acceptable and nonacceptable arcs, to be described, responsive to field sensor 62 and generating an arc indicative signal in response to a given characteristic of the field responsive signal. The response circuit also includes a trip circuit, to be described, responsive to the arc indicative signal and generating a gating signal supplied to the gate of SCR 58 to gate the SCR into conduction and energize coil 60 to in turn open breaker contacts 54. The outputs of circuits 56 and 64 are connected at a common node 65 to the gate of SCR 58. If the circuit breaker does not have GFI circuit 56, the SCR 58 and coil 60 are added, together with transducer 62 and response circuit 64. It is preferred that the present circuitry be used with a GFI circuit, for example as shown in U.S. Pat. No. Re30,678, incorporated herein by reference.

Figure 3:
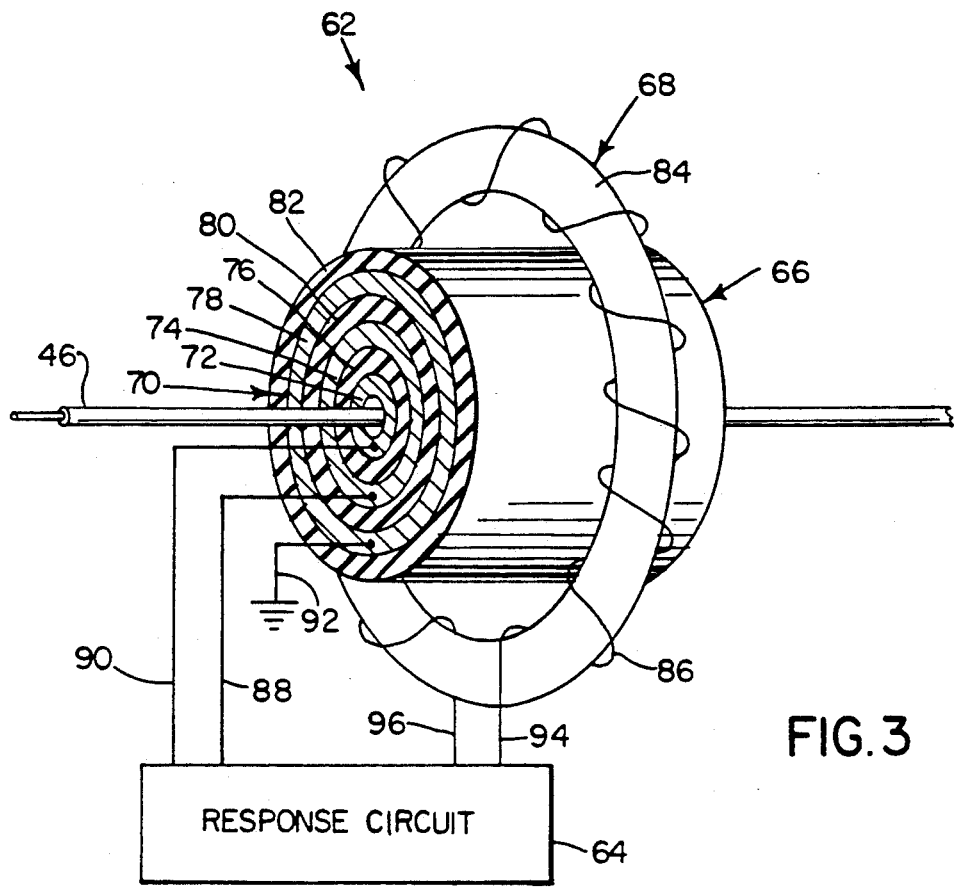
FIG. 3 shows an arc detector transducer sensor.

Arc detector transducer 62 comprises an E (electric) field sensor 66, FIG. 3, sensing the E field established about conductor 46 by the occurrence of an electrical arc in the circuit, and a B (magnetic) field sensor 68 sensing the B field established about conductor 46 by the occurrence of an electrical arc in the circuit. E field sensor 66 and B field sensor 68 are each electrically isolated from and distributed about a segment of conductor 46. The arc detector transducer further includes intensifying structure 70 adjacent E field sensor 66 and intensifying the E field at E field sensor 66. E field sensor 66 is between conductor 46 and intensifying structure 70. Intensifying structure 70 is also adjacent B field sensor 68 and between conductor 46 and B field sensor 68. Intensifying structure 70 is concentric to E field sensor 66, and B field sensor 68 is concentric to intensifying structure 70.

In preferred form, E field sensor 66 is a Faraday ring, B field sensor 68 is a current transformer, and intensifying structure 70 is a grounded ring. The transducer structure includes a first electrically conductive annular sleeve 72 around conductor 46, a second electrically conductive sleeve 74 around sleeve 72 and spaced therefrom by a first electrically insulative sleeve 76, and a third electrically conductive annular sleeve 78 around sleeve 74 and spaced therefrom by a second electrically insulative annular sleeve 80, and including a third electrically insulative annular sleeve 82 around sleeve 78. The transducer further includes a magnetically permeable torodial core 84 around sleeve 78 and spaced therefrom by insulative sleeve 82. Core 84 has a conductive wire coil 86 wrapped therearound. Conductive sleeves 72 and 74 provide the Faraday ring and have leads 88 and 90 connected to response circuit 64. Sleeve 78 provides the noted intensifying structure 70 and is grounded at lead 92. Coil 86 on core 84 provides the current transformer and has leads 94 and 96 connected to response circuit 64. Sleeve 78 provides a grounded conductor between current transformer 68 and electrified conductor 46 and shields current transformer 68 from the radiated E field from conductor 46. The Faraday ring provided by sleeves 72 and 74 is between grounded conductor 78 and electrified conductor 46. Grounded conductor 78 intensifies the E field at the Faraday ring 72, 74. In the embodiment shown, E field sensor 66 senses the E field radiated from an electrical arc in the electric circuit and propagating along conductor 46 as a waveguide, and B field sensor 68 senses the B field due to conduction of current in line 46, though other combinations are possible.

Figure 4:
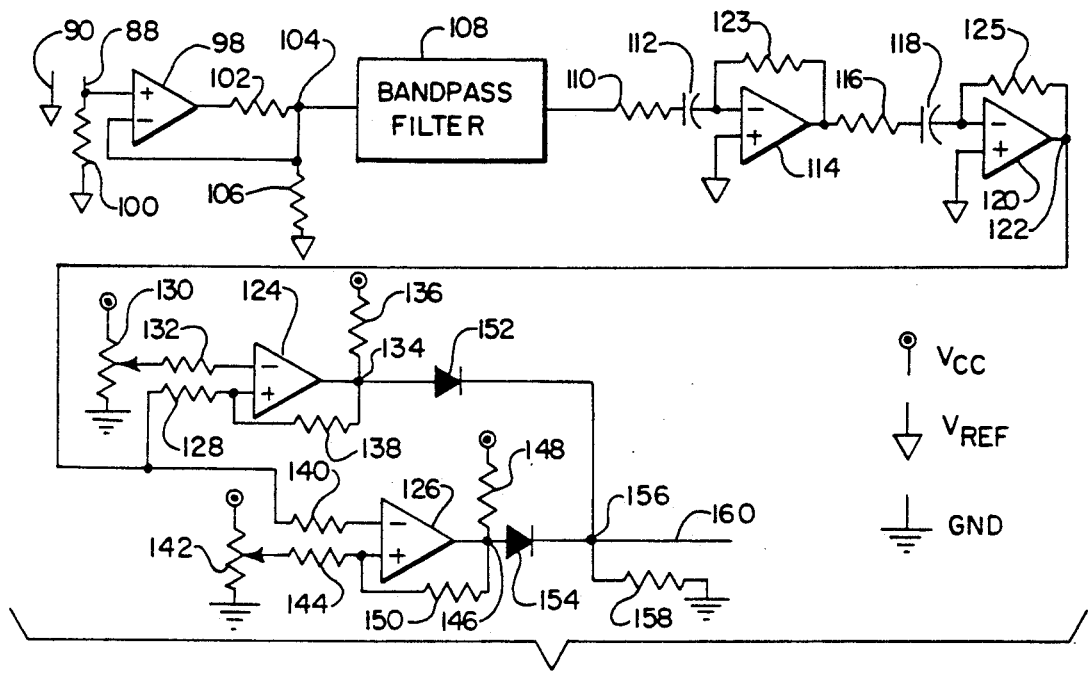
FIG. 4 is a circuit diagram showing an E field amplitude chaos detection circuit.

FIG. 4 shows arc discrimination circuitry for processing the E field responsive signal. E field sensor lead 88 is connected to the noninverting input of an operational amplifier 98, FIG. 4, provided by a 34074 amplifier. The noninverting input of the amplifier is referenced through resistor 100 to a reference voltage Vref which is provided by a power supply circuit, to be described. E field sensor lead 90 is connected to Vref. The output of amplifier 98 is fed back to the inverting input and is also supplied through resistor 102 to node 104 which is referenced through resistor 106 to Vref. The output s at node 104 is supplied through band-pass filter 108 provided by a Datel FLT-U2 circuit, having a passband of 100 KHz to 1,000 KHz, which passband excludes the frequency of voltage source 26, namely 60 Hz. After the field responsive signal is amplified and bandpass filtered, it is differentiated twice with respect to time to provide the second derivative of the field responsive signal. The signal is passed through resistor 110, differentiating capacitor 112, a 34074 amplifier 114, resistor 116, differentiating capacitor 118, and a 34074 amplifier 120 to provide at output node 122 the second derivative of the field responsive signal. Resistors 123 and 125 control the amount of gain. An electrical arc in the electric circuit in FIG. 2 is characterized by a random chaotic pattern of the field responsive signal from leads 88 and 90 generated in response to the electromagnetic field established about conductor 46 due to the occurrence of such arc. The arc discrimination circuit, including the dual differentiator circuit differentiating the field responsive signal twice with respect to time to provide the second derivative of the field responsive signal, provides an easy manner of checking for a random chaotic pattern of the field responsive signal.

The signal at node 122 is supplied to a window comparator circuit including LM339 comparators 124 and 126. The signal from node 122 is supplied through resistor 128 for comparison against a first reference value supplied from Vcc, from the noted power supply circuit, to be described, through potentiometer 130 and resistor 132. When the second derivative of the E field responsive signal positively exceeds the noted first reference value, comparator 124 generates a positive output at node 134. Resistor 136 provides a pull-up resistor, and resistor 138 provides a small amount of hysteresis on the comparator threshold to help assure clean transitions. Comparator 126 compares the signal from node 122 supplied through resistor 140 against a second reference value from Vcc supplied through potentiometer 142 and resistor 144, and provides a positive output at node 146 when the second derivative of the E field responsive signal negatively exceeds the noted second reference value. Resistor 148 is a pull-up resistor, and resistor 150 provides a small amount of hysteresis on the comparator threshold to help assure clean transitions. The comparator outputs at nodes 134 and 146 are supplied through respective diodes 152 and 154 and are hard wired ORed at node 156 and referenced to ground through resistor 158 and supplied on output lead 160 for further processing, to be described.

Figure 5:
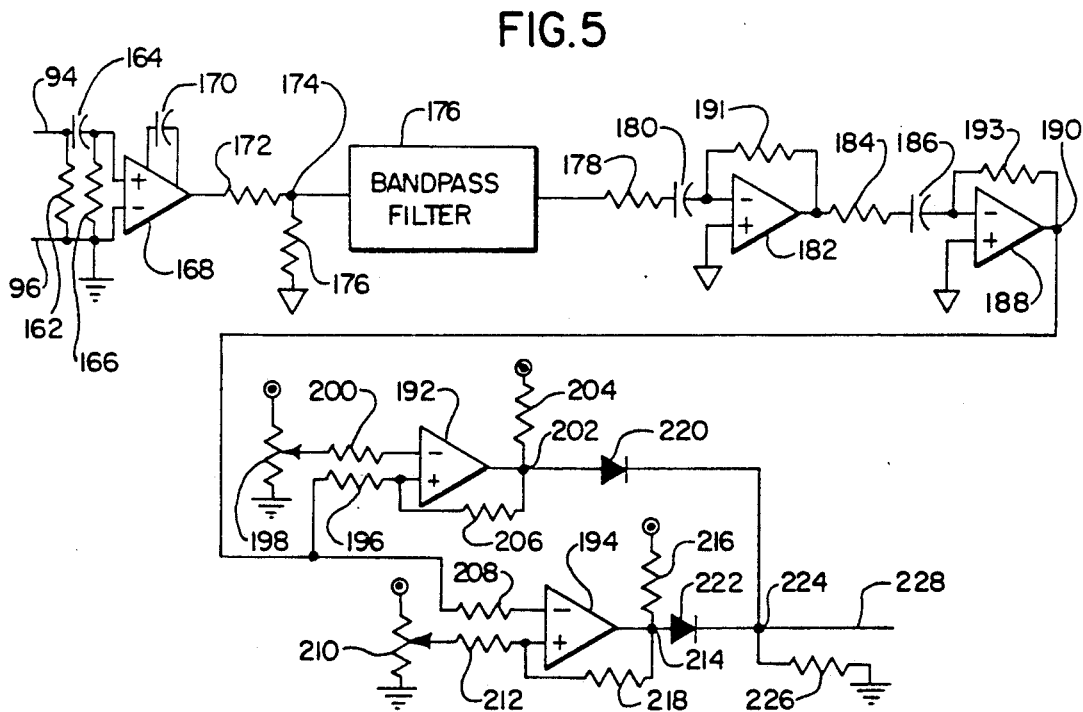
FIG. 5 is a circuit diagram showing a B field amplitude chaos detection circuit.

FIG. 5 shows arc discrimination circuitry for processing the B field responsive signal, and is similar to the E field arc discrimination circuitry of FIG. 4. B field sensor leads 94 and 96 are connected across burden resistor 162 and then connected through the filter provided by capacitor 164 and resistor 166 to the inputs of an LM386 amplifier 168 having a gain-determining capacitor 170. The output of amplifier 168 is supplied through resistor 172 to node 174 which is referenced to Vref through resistor 176. The signal at node 174 is supplied through bandpass filter 176, provided by a Datel FLT-U2 circuit, having a passband of 100 KHz to 1,000 KHz, which passband excludes the noted frequency of voltage source 26, namely 60 Hz. The bandpass filtered signal is then supplied to a dual differentiating circuit which differentiates the B field responsive signal twice with respect to time to provide the second derivative thereof. The signal is supplied through resistor 178, differentiating capacitor 180, a 34074 amplifier 182, resistor 184, differentiating capacitor 186, and a 34074 amplifier 188 to node 190. Resistors 191 and 193 set the gain.

The second derivative of the B field responsive signal at node 190 is then supplied to a window comparator having LM339 comparators 192 and 194. Comparator 192 compares the signal from node 190 supplied through resistor 196 against a reference value from Vcc supplied through potentiometer 198 and resistor 200, and generates a positive output at node 202 when the second derivative of the B field responsive signal positively exceeds the noted reference value. Resistor 204 is a pull-up resistor, and resistor 206 provides a small amount of hysteresis on the comparator threshold to help assure clean transitions. Comparator 194 compares the signal from node 190 supplied through resistor 208 against a reference value supplied from Vcc supplied through potentiometer 210 and resistor 212, and generates a positive output at node 214 when the second derivative of the B field responsive signal negatively exceeds the noted reference value. Resistor 216 is a pull-up resistor, and resistor 218 provides a small amount of hysteresis on the comparator threshold to help assure clean transitions. The comparator outputs at nodes 202 and 214 are supplied through respective diodes 220 and 222 and are hard wired ORed at node 224 and referenced to ground through resistor 226 and output on lead 228 for further processing, to be described.

The arc discrimination circuitry in FIGS. 4 and 5 responds to the E and B field sensors 66 and 68 and generate an arc indicative signal at respective output leads 160 and 228 in response to a random chaotic pattern of the respective field responsive signal. Chaos in the noted field responsive signals in the noted passband frequency range indicates an arc in the circuit. The signal on lead 160 and/or the signal on lead 228 may be used as a trip signal to trip circuit breaker 34 or otherwise indicate an arcing condition. Alternatively, and in the preferred embodiment, the signals on leads 160 and 228 are treated as tentative arc indicative signals, and further conditions must be met before a confirmed arc signal is generated or otherwise before circuit breaker 34 is tripped. One of these further conditions is a direction indicative signal indicating which direction the arc is from, namely whether from the load side or the line side, to be described. Another condition is satisfaction of appropriate dual timing windows, to be described. Thus, in the preferred embodiment, the signals on leads 160 and 228 are considered tentative arc indicative signals.

Figure 6:
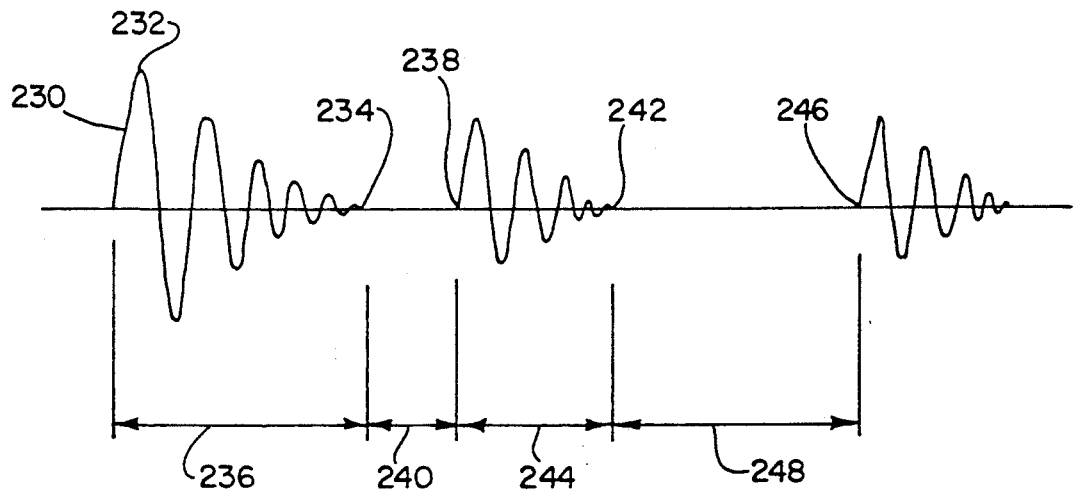
FIG. 6 schematically illustrates ring-out frequency and repeat frequency.

The arc discrimination circuitry in FIGS. 4 and 5 detects chaos in the amplitude of the respective E and B field responsive signals. This has been found sufficient, and hence is preferred for simplicity. Alternatively, circuitry is also provided to sense chaos in the frequency of the E and B field responsive signals. A random chaotic pattern of the frequency of the field responsive signal is also indicative of an arc in the circuit. For example, FIG. 6 shows a field responsive signal 230 generated by the field sensor and having an initial peak amplitude 232 which decreases to zero at 234 at a ring-out frequency represented by interval 236. The amplitude then increases again at 238 at a repeat frequency represented by interval 240. The amplitude then decreases to zero at 242 at a ring-out frequency represented by interval 244, and then increases again at 246 at a repeat frequency represented by interval 248. A random chaotic pattern of the ring-out frequency, represented by intervals 236, 244, and so on, is characteristic of an arc in the circuit. A random chaotic pattern of the repeat frequency, represented by intervals 240, 248, and so on, is also characteristic of an arc in the circuit.

In FIG. 7, E field sensor lead 90 is connected to Vref, and lead 88 is connected to the noninverting 30 input of a 34074 amplifier 250, which input is referenced through resistor 252 to Vref. The output of amplifier 250 is supplied to an amplitude peak detector circuit provided by diode 254, capacitor 256, resistor 258, capacitor 260, resistor 262, and a 34074 amplifier 264. The amplitude demodulated signal is then supplied through a low pass filter provided by resistor 266 and capacitor 268 to eliminate frequencies above about 1,000 KHz. The low pass filtered field responsive signal is then supplied to a dual differentiator circuit including resistor 270, differentiating capacitor 272, a 34074 amplifier 274 providing a first differentiating stage, and then through resistor 276, differentiating capacitor 278, and a 34074 amplifier 280 providing the second stage of differentiation. Feedback resistors 282 and 284 set the gain. The output at node 286 is the second derivative of the low pass filtered peak detected amplitude of the E field responsive signal.

The output of amplifier 250 is also supplied through the high pass filter network provided by capacitor 288 and resistor 290 and then supplied through resistor 292 to the noninverting input of a 339 comparator 294 whose inverting input is supplied from Vref through resistor 296. Resistor 298 is a pull-up resistor, and resistor 300 sets the hysteresis. The output of comparator 294 at node 302 goes high when the input through resistor 292 is higher than Vref supplied through resistor 296, and is low when the input through resistor 292 is lower than Vref supplied through resistor 296, such that comparator 294 converts an incoming sine wave to an outgoing square wave which is fed to a 4098 monostable multivibrator 304, where manufacturer assigned pin designations are shown in FIG. 7 and throughout the drawings to facilitate understanding. Resistor 306 and capacitor 308 set the duration of the timed output pulse on lead 310 which is supplied through rectifying diode 312 and resistor 314 to charge capacitor 316, having a slower discharge resistor 318, and providing a DC voltage at node 320. The magnitude of the DC voltage at node 320 is proportional to the number of times within a given period during which a rising edge appears at output node 302 of comparator 294 triggering monostable multivibrator 304, such that the DC voltage at node 320 is proportional to the frequency of the signal input to comparator 294. The frequency proportional signal at node 320 is supplied to a dual differentiator circuit including resistor 322, differentiating capacitor 324, and a 34074 amplifier 326 providing the first derivative with respect to time, and through resistor 328, differentiating capacitor 330, and a 34074 amplifier 332 providing the second derivative with respect to time at output node 334. Resistors 336 and 338 set the gain.

The signal at node 286 from amplifier 280 is supplied to a window comparator including LM339 comparators 340 and 342. Comparator 340 compares the signal from node 286 supplied through resistor 344 against a reference value from Vcc supplied through potentiometer 346 and resistor 348, and generates a positive output at node 350 when the second derivative of the amplitude of the E field responsive signal from node 286 positively exceeds the noted reference value. Resistor 352 is a pull-up resistor, and resistor 354 provides a small amount of hysteresis on the comparator threshold to help assure clean transitions. Comparator 342 compares the signal from node 286 supplied through resistor 356 against a reference value provided from Vcc through potentiometer 358 and resistor 360, and generates a positive output at node 362 when the second derivative of the amplitude of the E field responsive signal negatively exceeds the noted reference value. Resistor 364 is a pull-up resistor, and resistor 366 provides a small amount of hysteresis on the comparator threshold to help assure clean transitions.

The second derivative of the frequency of the E field responsive signal at node 334 from comparator 332 is supplied to a window comparator provided by LM339 comparators 368 and 370. Comparator 368 compares the signal from node 334 supplied through resistor 372 against a reference value from Vcc supplied through potentiometer 374 and resistor 376, and generates a positive output at node 378 when the second derivative of the frequency of the E field responsive signal at node 334 positively exceeds the noted reference value. Resistor 380 is a pull-up resistor, and resistor 382 provides a small amount of hysteresis on the comparator threshold to help assure clean transitions. Comparator 370 compares the signal from node 334 supplied through resistor 384 against a reference value from Vcc supplied through potentiometer 386 and resistor 388, and generates a positive output at node 390 when the second derivative of the frequency of the E field responsive signal at node 334 negatively exceeds the noted reference value. Resistor 392 is a pull-up resistor, and resistor 394 provides a small amount of hysteresis on the comparator threshold to help assure clean transitions.

The outputs of comparators 340 and 342 at nodes 350 and 362 are supplied through diodes 396 and 398 and hard wired ORed at node 400 and referenced to ground through resistor 402 and supplied to one of the inputs of AND gate 404. The outputs of comparators 368 and 370 at nodes 378 and 390 are supplied through diodes 406 and 408 and hard wired ORed at node 410 and referenced to ground through resistor 412 and supplied to the other input of AND gate 404. Resistors 402 and 412 insure that the respective gate inputs stay biased low when no high signals exist from respective nodes 400 and 410. The output of AND gate 404 is provided on lead 414 for further processing, to be described.

In FIG. 8, B field sensor leads 94 and 96 are connected across burden resistor 416 and connected through the filter network provided by capacitor 418 and resistor 420 to the inputs of an LM386 amplifier 422 having a gain-determining capacitor 424. The output of comparator 422 is provided to an amplitude peak detector circuit including diode 426, capacitor 428, resistor 430, capacitor 432, resistor 434, and a 34074 amplifier 436. The signal is then low pass filtered by resistor 438 and capacitor 440 to eliminate frequencies above about 1,000 KHz. The signal is then differentiated by resistor 442, differentiating capacitor 444, and a 34074 amplifier 446, and differentiated again by resistor 448, differentiating capacitor 450, and a 34074 amplifier 452, to provide the second derivative at node 454. Resistors 456 and 458 set the gain. The signal at node 454 is the second derivative of the amplitude demodulated signal of the B field responsive signal.

The output from amplifier 422 is also high pass filtered by capacitor 460 and resistor 462 and supplied through resistor 464 to the noninverting input of a 339 comparator 466, whose inverting input is supplied by Vref through resistor 468. Resistor 470 is a pull-up resistor, and resistor 472 sets the hysteresis. Comparator 466 operates like comparator 294 of FIG. 7 and converts an incoming sine wave to an outgoing square wave at node 474. The signal at node 474 triggers a 4098 one shot monostable multivibrator 476 having a timed output pulse whose duration is set by resistor 478 and capacitor 480. The output pulse on lead 482 is supplied through diode 484 and resistor 486 to charge capacitor 488, which has a slower discharge resistor 490. The DC voltage at node 492 is proportional to the frequency of the signal input to comparator 466, similarly to FIG. 7. The frequency proportional DC signal at node 492 is differentiated by a first stage provided by resistor 494, differentiating capacitor 496, and a 34074 amplifier 498, and differentiated again by a second stage provided by resistor 500, differentiating capacitor 502, and a 34074 amplifier 504, to provide the second derivative at node 506. Resistors 508 and 510 set the gain. The signal at node 506 is the second derivative of the frequency of the B field responsive signal.

The second derivative of the amplitude of the B field responsive signal at node 454 from amplifier 452 is supplied to a window comparator circuit having LM339 comparators 512 and 514. Comparator 512 compares the signal from node 454 supplied through resistor 516 against a reference value from Vcc supplied through potentiometer 518 and resistor 520, and generates a positive output at node 522 when the second derivative of the amplitude of the B field responsive signal positively exceeds the noted reference value. Resistor 524 is a pull-up resistor, and resistor 526 provides a small amount of hysteresis on the comparator threshold to help assure clean transitions. Comparator 514 compares the signal from node 454 supplied through resistor 528 against a reference value from Vcc supplied through potentiometer 530 and resistor 532, and generates a positive output at node 534 when the second derivative of the amplitude of the B field responsive signal negatively exceeds the noted reference value. Resistor 536 is a pull-up resistor, and resistor 538 provides a small amount of hysteresis on the comparator threshold to help assure clean transitions.

The second derivative of the frequency of the B field responsive signal at node 506 from amplifier 504 is supplied to a window comparator circuit provided by LM339 comparators 540 and 542. Comparator 540 compares the signal from node 506 supplied through resistor 544 against a reference value from Vcc supplied through potentiometer 546 and resistor 548, and generates a positive output at node 550 when the second derivative of the frequency of the B field responsive signal positively exceeds the noted reference value. Resistor 552 is a pull-up resistor, and resistor 554 provides a small amount of hysteresis on the comparator threshold to help assure clean transitions. Comparator 542 compares the signal from node 506 supplied through resistor 556 against a reference value from Vcc supplied through potentiometer 558 and resistor 560, and generates a positive output a node 562 when the second derivative of the frequency of the B field responsive signal negatively exceeds the noted reference value. Resistor 564 is a pull-up resistor, and resistor 566 provides a small amount of hysteresis on the comparator threshold to help assure clean transitions.

The outputs of comparators 512 and 514 at nodes 522 and 534 are supplied through diodes 568 and 570 and are hard wired ORed at node 572 and referenced to ground through resistor 574 and supplied to one input of AND gate 576. The outputs of comparators 540 and 542 are supplied through diodes 576 and 578 and are hard wired ORed at node 580 and referenced to ground through resistor 582 and supplied to the other input of AND gate 576. Resistors 574 and 582 assure that the respective inputs to gate 576 stay biased low when no high signals exist at respective nodes 572 and 580. The output of AND gate 576 is provided on lead 584 for further processing, to be described.

The B field sensor 68, FIG. 3, has a powdered iron core 84 with a permeability of about ten, and has a signal pick-up winding 86 of 100 turns of wire. Resistor 416 provides a burden load for current transformer matching. Sleeve 78 minimizes E field coupling to B field sensor 68. The voltage signal produced across resistor 416, FIG. 8, corresponds to the sensed B field. The signal is coupled to the input of amplifier 422 by a high pass filter provided by capacitor 418 and resistor 420. The amplitude modulation behavior of the B field responsive signal is derived by feeding the amplified signal through a peak detector or demodulator circuit similar to that used in AM radios. The peaks are rectified and filtered by diode 426 and capacitor 428, and then further filtered by resistor 430, capacitor 432, and resistor 434, such that the signal across capacitor 432 will correspond to amplitude variations occurring up to a rate of about 20 KHz on an arc signature with basic frequency content up to about 1,000 KHz. The demodulated AM, i.e. peak detected AM, signal is then fed to a source follower stage operational amplifier 436 to buffer the signal to a stiff low impedance level suitable for driving subsequent processing stages. The signal now accurately represents a signature of the actual amplitude modulation pattern of the chaotic arc induced field responsive signal. In the next stage, the rate of change, i.e. first derivative, of the peak detected signal is determined, and then the rate of change of the rate of change, i.e. second derivative, is determined, which will provide a measure of the chaos in the field responsive signal. The first derivative is determined with a differentiation stage including resistor 442, capacitor 444, resistor 456, and operational amplifier 446, which is a conventional active operational differentiator circuit. The resultant rate of change output signal is then fed to a subsequent similar differentiator stage provided by resistor 448, capacitor 450, resistor 458 and op amp 452. The output at node 454 is the second derivative of the peak detected AM signal, which is a measure of the chaotic behavior of the amplitude of the field responsive signal.

In addition to the amplitude behavior circuitry in FIGS. 7 and 8, frequency behavior circuitry is included to monitor perturbations in the frequency of the arc induced field responsive signal. In FIG. 8, the output from amplifier 422 fed to the AM peak detector processing circuit, beginning at diode 426, and is also fed to a frequency to voltage converter which provides an output voltage which varies in accordance with frequency changes, which frequency proportional voltage is processed for first and second derivatives, similarly to the AM signal, to determine the degree of frequency chaos. The amplified output signal from amplifier 422 is fed to a shaping circuit or zero cross over detector provided by comparator 466, capacitor 460, resistor 462, resistor 464, resistor 468, resistor 472, and resistor 470. As the field responsive signal, as coupled through capacitor 460 and resistor 464 to the noninverting input of comparator 466, swings positive and negative, the comparator input swings accordingly above and below the reference potential at the inverting input coupled through resistor 468. Each time the signal swings above the reference, the comparator output at node 474 toggles high, and when the signal swings back below the reference the comparator output at node 474 toggles back low. Thus, a square wave signal is produced which corresponds to the frequency of the input signal, but which does not show the amplitude variations. Resistor 470 is a pull-up resistor, and resistor 472 provides a small amount of hysteresis to provide clean transitions. The square wave signal at node 474 is fed to 4098 monostable one shot multivibrator circuit 476 which converts each input pulse to a precision finite width pulse, independent of the width of the input pulse. The width of the output pulse from monostable circuit 476 is determined by resistor 478 and capacitor 480. The monostable output pulses on lead 482 are fed through a rectifier and filter stage which integrates the pulses to a level corresponding to the rate at which the pulses occur, establishing a frequency to voltage conversion. Diode 484 decouples the monostable circuit from the filter components such that during the high output duration of the pulse, current flows through diode 484 and charging resistor 486 into integrating capacitor 488 and discharge resistor 490. During the off portion of the monostable pulse, diode 484 prevents reverse filter discharge, thus providing a rectification action. Discharge of capacitor 488 occurs through resistor 490. The alternating charging from diode 484 and resistor 486, and discharging through resistor 490, produces a voltage across capacitor 488 which averages out to correspond to the rate at which the finite width monostable pulses occur. If the rate or frequency remains constant, the voltage at node 492 will stay at a specific level. If the rate changes, i.e. there are frequency variations, the voltage at node 492 will vary in accordance with the changes. The discharge time constant of capacitor 488 is chosen to permit fast rate changes to be observed yet filter out unwanted high frequency components. The signal is then fed to the two cascaded differentiator circuits, to provide the second derivative at node 506 which indicates the presence of chaos in the frequency of the field responsive signal.

FIG. 9 shows direction sensing circuitry. Electrified line conductor 46, FIGS. 2 and 9, has a line side extending from the arc detector to voltage source 26, and a load side extending from the arc detector to load 30. The direction sensing circuitry of FIG. 9 detects whether a sensed arc is from the load side or the line side, and generates a direction indicative signal. As will be described, the arc discrimination circuitry responds to the field sensor and generates an arc indicative signal in response to a given characteristic of the field responsive signal in combination with a given characteristic of the direction indicative signal.

The direction sensing circuit includes an inductor 586 providing a choke connected in series in electrified line conductor 46 between the line side and the load side. Capacitor 588 is connected between the line side of inductor 586 and neutral conductor 48. Capacitor 590 is connected between the load side of inductor 586 and neutral conductor 48. Capacitor 588 and inductor 586 form in combination a first choke filter attenuating propagation of high frequency signals from the load side through the inductor. It is preferred that frequencies above the 60 Hz excitation frequency of voltage source 26 be so attenuated. Capacitor 590 and inductor 586 form in combination a second choke filter attenuating propagation of the noted higher frequency signals from the line side through the inductor.

A frequency selective circuit is provided by a capacitor 592 and a resistor 594 connected in series therewith and forming an RC filter, and by capacitor 596 and a resistor 598 connected in series therewith and forming an RC filter. Capacitor 592 is coupled to the line side of inductor 586 and to capacitor 588 and passes the noted higher frequencies and blocks the noted excitation frequency of voltage source 26, namely 60 Hz. Capacitor 596 is coupled to the load side of inductor 586 and to capacitor 590 and passes the noted higher frequencies and blocks the noted 60 Hz excitation frequency.

A capacitor 600 is charged to a DC level through capacitor 592, rectifying diode 602 and resistor 604. Resistor 606 is coupled to capacitor 600 for discharging same. Resistor 606 has a higher resistance than resistor 604 such that capacitor 600 discharges at a slower rate than it charges. Capacitor 608 is charged to a DC level through capacitor 596, rectifying diode 610 and resistor 612, and is discharged through resistor 614. Resistor 614 has a higher resistance value than resistor 612 such that capacitor 608 discharges at a slower rate than it charges.

An LM339 comparator 616 has a first input 618 coupled to capacitor 608, a second input 620 coupled to capacitor 600, and an output on lead 622 providing a direction indicative signal. A high state on output lead 622 provides a load direction indicative signal because it corresponds to a high state of input 618 relative to input 620 which in turn corresponds to a higher voltage at the load side of inductor 586 than the line side of inductor 586. A low state at output lead 622 provides a line direction indicative signal because it is produced by a low state of input 618 relative to input 620 which in turn corresponds to a lower voltage at the load side of inductor 586 relative to the line side of inductor 586. A low state at output lead 622 also results when there is no arc indicative signal present.

A power supply for the direction sensing circuitry is provided by the voltage from line 46 supplied through resistor 624, rectifying diode 626, filtering capacitor 628, resistor 630, and clamping zener diode 632, which provides a power supply voltage at node 634 for comparator 616, and which is also supplied through resistor 636, potentiometer 638, and resistor 640 for varying the threshold at comparator input 620. Comparator output lead 622 is connected through pull-up resistor 642 to node 634 and is also connected to the anode of LED 644 which is optically coupled to light responsive transistor 646. When the voltage level at comparator input 620 is higher than that at comparator input 618, comparator output 622 is low, and LED 644 is off. When the voltage level at comparator input 618 is higher than that at comparator input 620, comparator output 622 is high, and LED 644 is biased into conduction and emits light to optically trigger transistor 646 into conduction to conduct current from Vcc through resistor 648 and provide a high state at node 650, which is provided on output lead 652 for further processing, to be described.

As will be described, it is preferred that at least three conditions be met for an arc indicative signal to be generated. One of the conditions is a high state on output lead 652, meaning that the arc is from the load side. This contingency is particularly desirable in applications such as shown in FIGS. 1 and 2 to eliminate false tripping due to arcs coming from the power utility company transformer which in turn may be induced on the line from another household residence connected to the power utility company transformer. The direction indicative contingency condition insures that an arc indicative signal will be generated only if the arc is coming from the load side of conductor 46, meaning that the circuit breaker 34 will be tripped only if the arc is from a load supplied by a circuit breaker in the owner's residence, and not by a load in a neighbor's residence. The other conditions necessary to generate an arc indicative signal involve a given characteristic of the field responsive signal, preferably a given characteristic of both the E field responsive signal in combination with a given characteristic of the B field responsive signal, and further preferably a random chaotic pattern of the E field responsive signal and a random chaotic pattern of the B field responsive signal, though other characteristics may be used, to be described.

Inductor 586 is preferably an RF choke capable of carrying the normal AC line current loads without overheating at rated line current, and without saturating at six times rated line current. In one embodiment, a torodial powdered iron core choke was used having an inductance of approximately 65 microhenries, though a wide range of choke types and values may be used. If the arc occurs downstream on the load side of the choke, the arc signal will propagate back toward the choke at a given magnitude. Conducted high frequency components of the signal will not propagate through the choke and into the line side without significant attenuation due to the choke inductive reactance and the shunting effect of capacitor 588 combining to form an effective filter. If the high frequency signal voltage levels are measured on each side of the choke and compared, a measurable difference will be observed between the load side and the line side. Conversely, if the arc occurs on the line side, the high frequency arc information will now exist on the line side of the choke, and will be attenuated on the load side due to the filter formed by the choke and capacitor 590. Thus, by observing which side of the choke the amplitude of the high frequency arc signal is highest, the direction of origination of the arc can be determined.

At each end of the choke, high frequency signals are sampled through small coupling capacitors 592 and 596, for example 47 picofarads, and fed to resistors 594 and 598, for example 10 killoohms. The RC differentiating time constants of these values permit very little of the 60 Hz line frequency signal to be coupled, but the high frequency components will hardly be attenuated as observed across resistors 594 and 598, except that one will be greater than the other due to the choke filtering noted above. Both signals are then rectified by respective diodes 602 and 610, and filtered by RC networks to produce DC voltages proportional to the arc signal magnitude. The DC voltages are then compared, and if the voltage corresponding to the load side of the choke is higher than that for the line side, an output high logic signal is generated at lead 622. If the voltages are reversed, a low logic signal is produced at lead 622.

The rectified signal from diode 610 charges filter capacitor 608 through resistor 612. The resistor 612, capacitor 608, resistor 614 time constant determines how fast the capacitor charges, and the capacitor 608, resistor 614 time constant determines the discharge rate when the signal ceases. The discharge rate is somewhat slower, to afford proper integration. If the arc exists on the load side of the choke, the DC voltage formed across capacitor 608 will be higher than that produced on capacitor 600. The two voltages are applied to the inputs of comparator 616, the output of which will toggle high if its noninverting input is at a higher DC voltage than its inverting input. An offset bias circuit provided by resistor 636, resistor 640, and potentiometer 638, is connected to the comparator inverting input to permit threshold adjustment of the toggle point as well as compensation for differences in comparator input offset voltages. Potentiometer 638 acts as a sensitivity control for the direction sensor, to adjust the required arc signal level and load side/line side signal differential necessary to produce a logic indication at output lead 622. The comparator output at lead 622 drives an optocoupler through current limiting resistor 642. The optocoupler is desired to provide interface isolation between the direction sensing circuit, which is coupled directly to the AC line at energized line conductor 46, and the other arc detector circuitry which is isolated from the line. The opto-coupler is also desired because of the differing power supply references. The DC power for comparator 616 is provided through rectifier diode 626, current limiting resistor 624, filter capacitor 628, resistor 630, and zener diode 632. Rectified, filtered voltage, which is produced across capacitor 628, is clamped and regulated at 12 volts DC by the zener regulator through resistor 630. This power supply circuit is sufficient to provide stable bias and reference voltages to the low power comparator/logic section of the direction sensing circuit. Other benefits of the choke/filter section in FIG. 9 are that the filter helps to keep other high frequency noise signals generated by certain types of loads from propagating back into the line side of the conductor, and further the filter acts as a line stabilization network to the load, presenting a predictable source impedance characteristic at the point where the arc detector circuitry is located. This reduces possible variations which might occur from one installation to another due to differences in source line and load line characteristics.

In another embodiment, FIG. 10, the direction sensing circuit is provided by a multiplier 654 multiplying the E and B field responsive signals from nodes 104, FIG. 4, and 174, FIG. 5, to provide at output 656 a direction indicative POYNTING vector, as in U.S. Pat. No. 4,810,954, incorporated herein by reference. The POYNTING vector approach eliminates the need to insert a choke 586 in series in line conductor 46. In the circuitry described hereinafter, the direction indicative signal on output lead 652 may alternatively be provided by the direction indicative signal on output lead 656.

Figure 11:
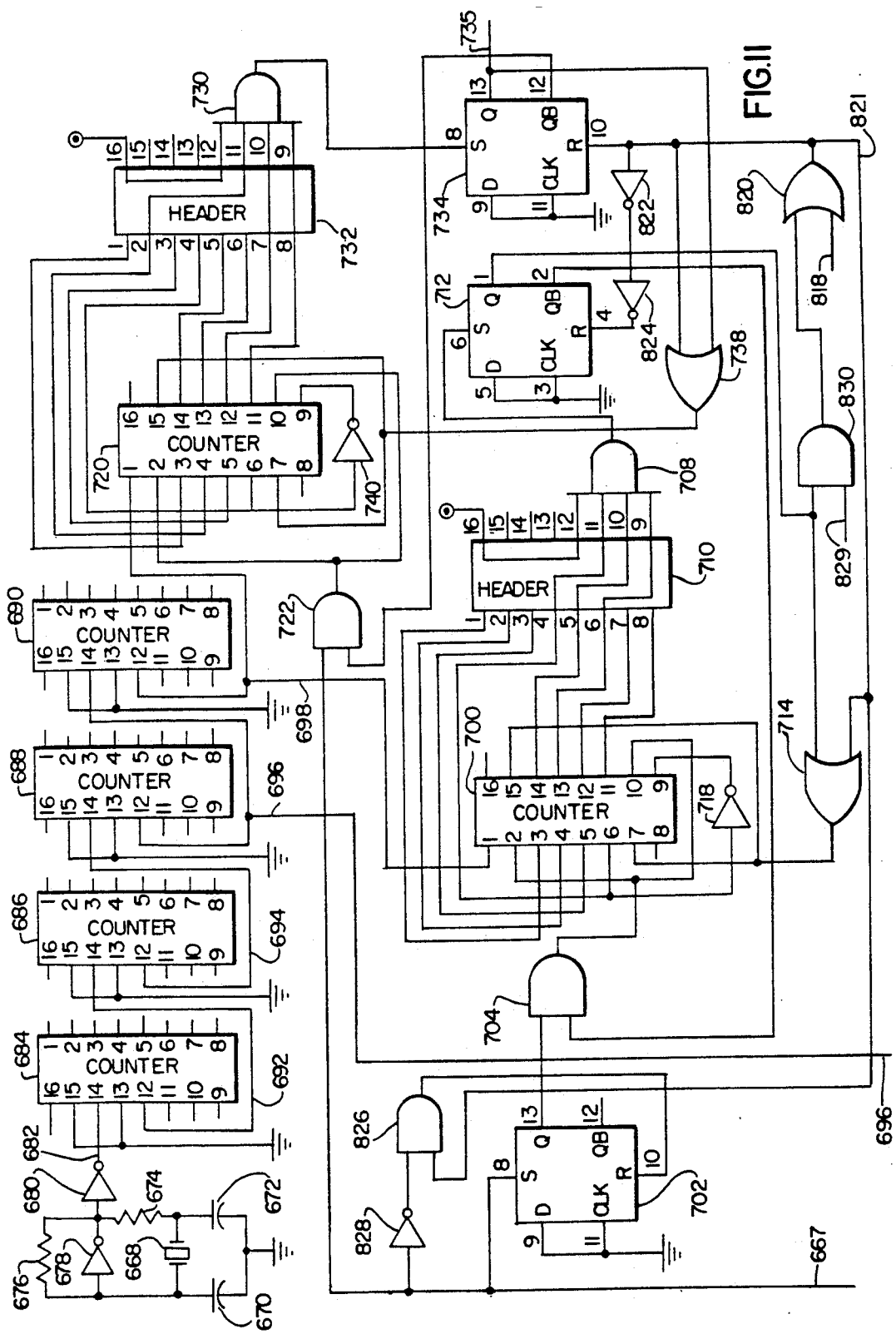
FIGS. 11-13 are a circuit diagram of a dual window timing circuit.
Figure 12:
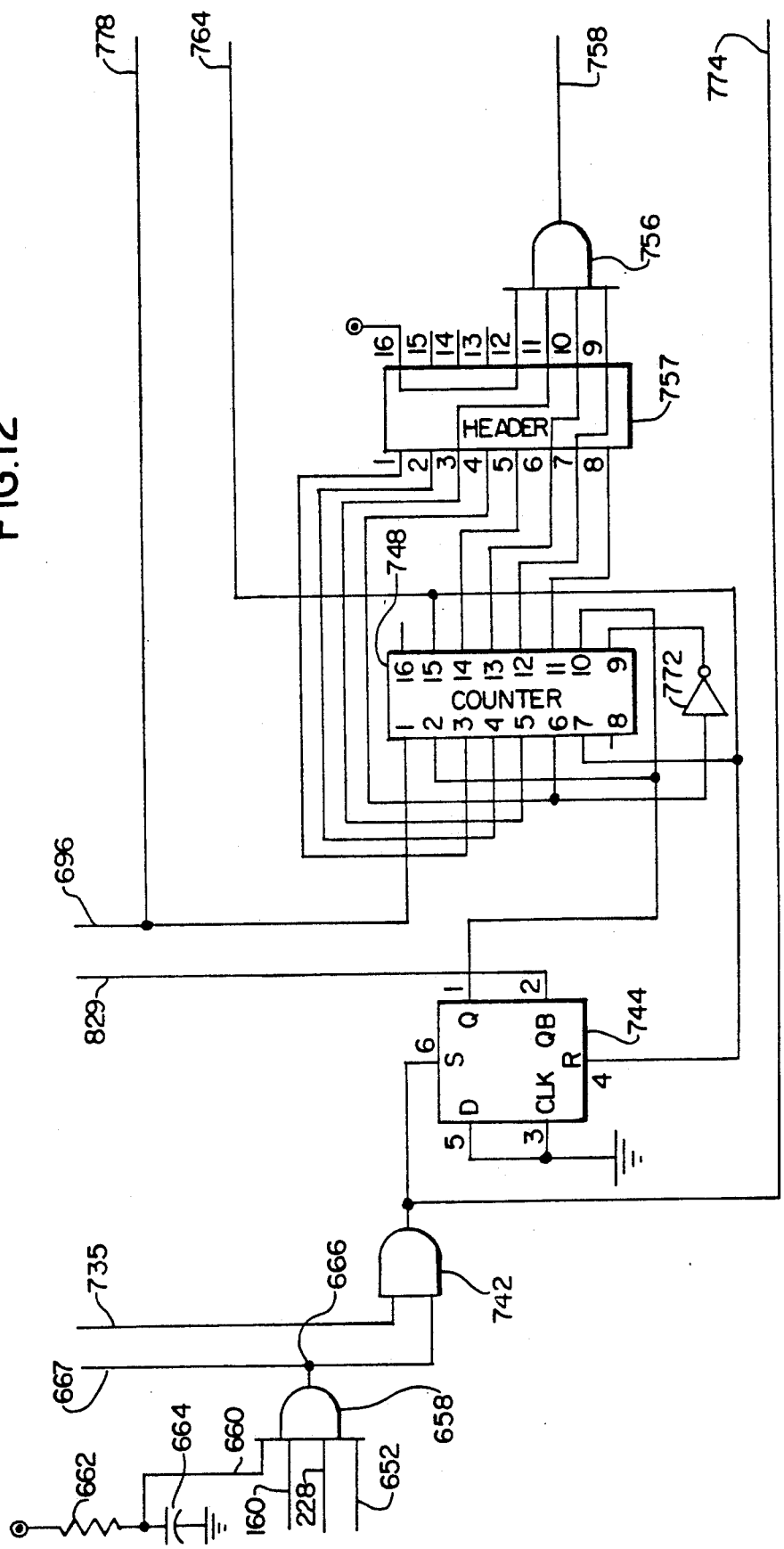
Figure 13:
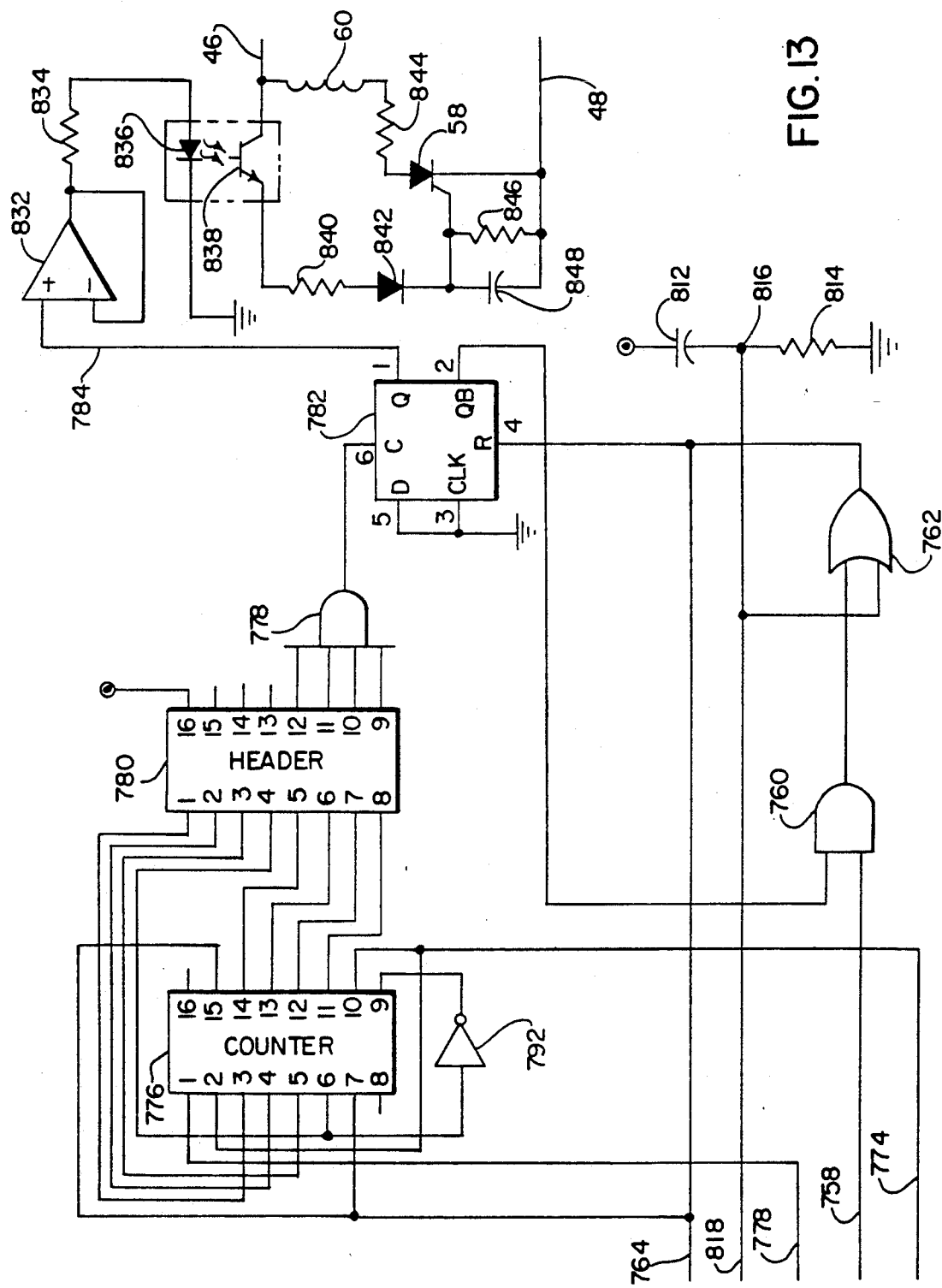

FIGS. 11-13 show dual window timing circuitry. A quad input AND gate 658, FIG. 12, has an E field input on lead 160 from FIG. 4, a B field input on lead 28 from FIG. 5, and a direction indicative input on lead 52 from FIG. 9. Alternatively, lead 414, FIG. 7, may be substituted for lead 160; and/or lead 584, FIG. 8, may be substituted for lead 228; and/or lead 656, FIG. 10, may be substituted for lead 652. AND gate 658 also has an input on lead 660 from a power-up circuit provided by resistor 662 and capacitor 664. When power is turned on, the voltage from Vcc initially charges capacitor 664 through resistor 662, such that the voltage on lead 660 is initially low, which in turn keeps the AND gate output at node 666 low. When capacitor 664 is charged, lead 660 is high, and AND gate 658 is controlled by its other inputs. A high state at AND gate output 666 is considered a tentative arc signal generated in response to a given characteristic of the field responsive signal, preferably the ANDed combination of the E field signal and the B field signal and the direction signal. Arc timing window circuitry responds to the arc discrimination circuit output at node 666 and generates a confirmed arc signal in response to a given timing characteristic of the tentative arc signal at node 666.

The timing circuit includes a conventional oscillator circuit provided by oscillator 668, FIG. 11, capacitors 670 and 672, resistors 674 and 676, and inverters 678 and 680 outputting clock pulses of known frequency on lead 682. Crystal 668 is a 1 MHz crystal, and the inverter 678 and its associated resistors and capacitors provide a 1 MHz square wave output which is buffered by inverter 680 to provide a buffered output at lead 682. A set of four 4017 decade counters 684, 686, 688, 690 are serially connected to lead 682 in conventional manner and count the clock pulses and provide at their respective carry out ports a 100 KHz clock signal at lead 692, a 10 KHz clock signal at lead 694, a 1 KHz clock signal at lead 696, and a 100 Hz clock signal at lead 698. The counters are shown with their manufacturer assigned pin designations, as are the other components throughout the drawings, to facilitate understanding.

A 4520 counter 700, FIG. 11, is initiated by the tentative arc signal at node 666, FIG. 12, on lead 667, and counts the 100 Hz clock pulses from lead 698 up to a given count. The tentative arc signal at node 666 is supplied on lead 667 to the set input of a 4013 flip flop 702, whose Q output goes high when the tentative arc signal at node 666 on lead 667 goes high. The high Q output state is supplied through AND gate 704 to initiate counter 700 which counts clock pulses up to a given count. Counter 700 is enabled by flip flop 702 when the latter is set. This initiates a timing window 706, FIG. 14. The timer times out when all of the inputs to 4082 AND gate 708 supplied through header 710 are high, such that the output of AND gate 708 goes high which in turn sets 4013 flip flop 712, whose QB output then goes low which in turn toggles the output of AND gate 704 low such that counter 700 stops counting. The Q output of flip flop 712 goes high and is applied through OR gate 714 to reset counter 700 to zero count. The end of timing window 706 is shown at 716 in FIG. 14. The length of window 706 is preferably about 2 to 3 seconds. Inverter 718 permits cascading of the counter, as do inverters 740, 772, 792, for their respective counters, to be described, as is conventional.

Figure 14:
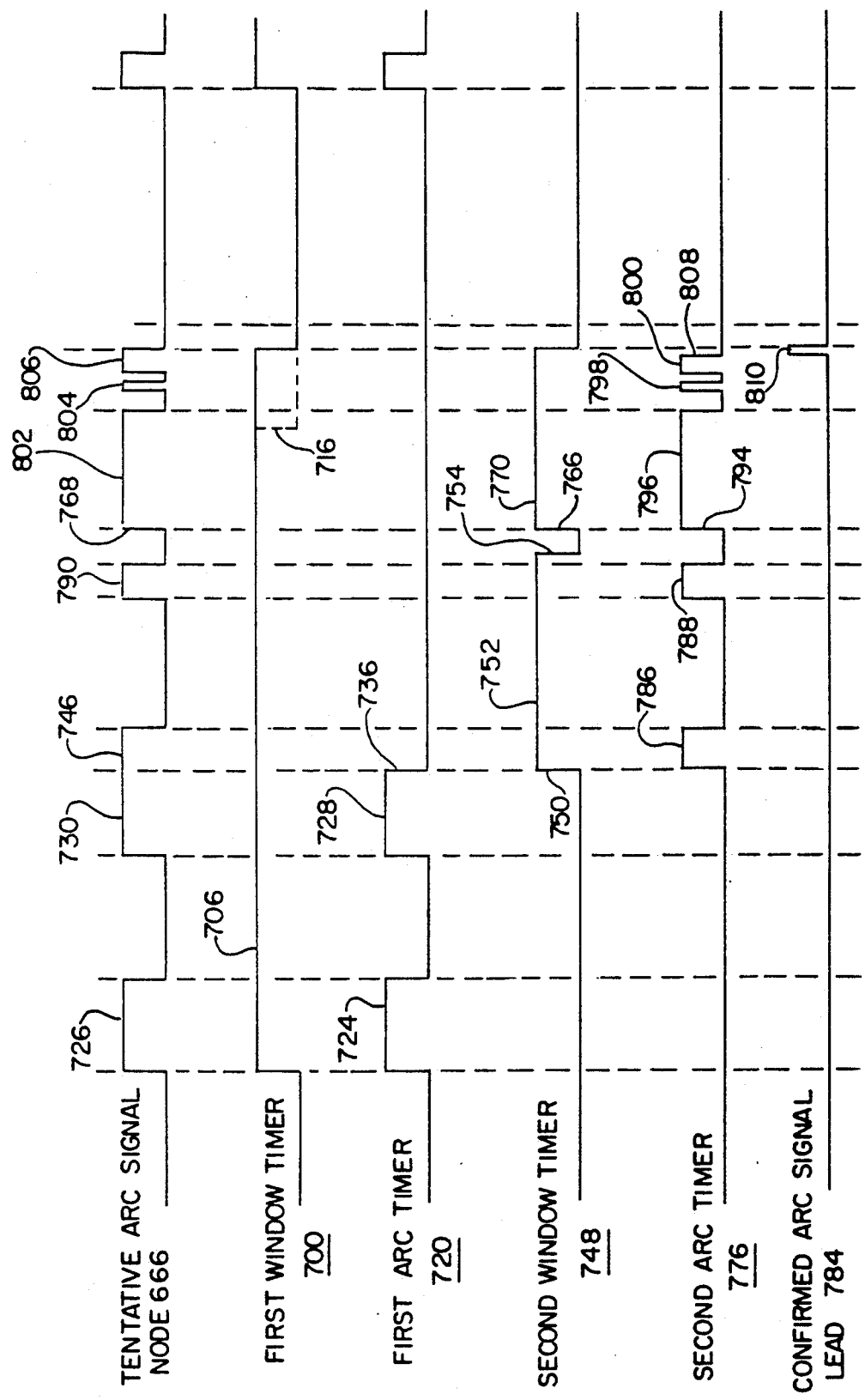
FIG. 14 is a timing diagram illustrating operation of the circuit of FIGS. 11-13.

Another 4520 counter 720, FIG. 11, is enabled by the tentative arc signal from node 666 on lead 667 supplied through AND gate 722. Counter 720 counts 100 Hz clock pulses from lead 698 when the tentative arc signal is present, for example as shown at counting interval 724 in FIG. 14 corresponding to the presence of the tentative arc signal at 726, and again at counting interval 728 corresponding to the presence of the tentative arc signal at 730. If counter 720 reaches a given count before the end of window 706, all of the inputs to AND gate 730 supplied through header 732 are high, corresponding to a given timed out condition of counter 720, which sets a 4013 flip flop 734. In FIG. 14, counter 720 has reached its given count at 736 before the end of window 706, i.e. the cumulative duration of intervals 724 and 728 has reached a given threshold. The given threshold in the examples shown is selected such that the cumulative duration of intervals 724 and 728 is about 0.5 second. When counter 720 times out and flip flop 734 is set, the low state at the QB output of flip flop 734 holds the output of AND gate 722 low such that counter 720 stops counting. The high state of the Q output of flip flop 734 is applied through OR gate 738 to reset counter 720 to zero count.

The Q output of flip flop 734, FIG. 11, is connected on lead 735 to an input of AND gate 742, FIG. 12, whose other input is connected to node 666. Flip flop 744 is set by the tentative arc signal if flip flop 734 is set, i.e. if the logic state on lead 735 is high. At threshold 736, FIG. 14, the Q output of flip flop 734 on lead 735 goes high, and if the tentative arc signal at node 666 is still present, as shown at 746, FIG. 14, the output of AND gate 742 goes high, which sets flip flop 744, which in turn enables a 4520 counter 748 to begin counting clock pulses, as shown at initiation transition 750 in FIG. 14 providing window 752. Counter 748 counts 1 KHz clock pulses from lead 696 up to a given count to provide window 752 of given duration, which in the present embodiment is 0.2 second. Upon reaching the given count at the end 754 of the window, counter 748 times out, and all of the inputs to AND gate 756 supplied through header 757 are high, such that the output of AND gate 756 goes high. The output of AND gate 756 is supplied on lead 758 to one of the inputs of AND gate 760, FIG. 13. In the absence of a confirmed arc signal, to be described, the other input to AND gate 760 is high, and hence when the output of AND gate 756 on lead 758 goes high, the output of AND gate 760 goes high, which high state is supplied through OR gate 762 and lead 764 to reset counter 748, FIG. 12, to zero count as shown at 754, FIG. 14. Counter 748 begins counting again at 766, FIG. 14, at the next arc indicative signal as shown at 768, thus initiating window 770.

The output of AND gate 742, FIG. 12, is also supplied on lead 774 to a 4620 counter 776, FIG. 13, such that counter 776 is enabled by the tentative arc signal at node 666 if flip flop 734, FIG. 11, is set. Counter 776 counts 1 KHz clock pulses on lead 778 from lead 696 up to a given count or threshold. When counter 776 times out, i.e. reaches the given count threshold, all of the inputs to AND gate 778 supplied through header 780 are high, such that the output of AND gate 778 goes high and sets a 4013 flip flop 782 which provides a confirmed arc signal on lead 784 when its Q output is high.

Counter timer 776 times the cumulative duration of the tentative arc signal during window 752, FIG. 14, as shown at arc intervals 786 and 788 corresponding to those portions of the tentative arc signal 746 and 790 occurring during window 752 after threshold 736. The count threshold selected for counter 776 in the given example is about 0.05 second. The cumulative duration of arc intervals 786 and 788 is less than 0.05 second, and hence counter 776 does not reach its threshold count before the end 754 of window 752. Thus, when counter 748 times out at 754, the output of AND gate 756, FIG. 12, goes high, which high state is supplied on lead 758 to AND gate 760, FIG. 13, whose other input is also high because flip flop 782 has not been set, and hence the output of AND gate 760 goes high which in turn is supplied through OR gate 762 to lead 764 which resets counter 748, FIG. 12, to zero count, to begin counting again at 766, FIG. 14, upon the next tentative arc signal transition at 768. The high state on lead 764 also resets counter 776.

Counter 776, FIG. 13, is again enabled by tentative arc signal transition 768, FIG. 14, and begins counting again at 794, and counts the cumulative duration of arc intervals 796, 798, 800, corresponding to the presence of the tentative arc signal at 802, 804, 806, respectively. In the example shown, the cumulative duration of tentative arc signal intervals 796, 798, 800 does reach 0.05 second during the window provided by counter timer 748, i.e. during window 770. Counter 776 thus times out as shown at 808, before the end of window 770, such that flip flop 782, FIG. 13, is set and generates an arc confirmed signal on lead 784 as shown at 810, FIG. 14.

An initialization circuit is provided by capacitor 812, FIG. 13, and resistor 814. At turn on, the voltage at node 816 is initially in a low state, but spikes high as capacitor 812 charges, after which the capacitor blocks the voltage from Vcc and provides a low state at node 816. The high state at node 816 caused by the spike initially enables the output of OR gate 762 to be high which in turn is supplied on lead 764 to reset counter 748, FIG. 12, and flip flop 744. The high state at node 816 is also supplied on lead 818 through OR gate 820, FIG. 11, to reset flip flop 734, and to reset flip flop 712 through delay inverters 822, 824. The initialization signal through OR gate 820 is also supplied on lead 821 to AND gate 826, whose other input is also initially high as supplied through inverter 828 receiving an initially low signal on lead 667 from node 666, FIG. 12, due to initialization circuit 662, 664. The initial high state at the output of AND gate 826, FIG. 11, resets flip flop 702. The noted resets are also accomplished through OR gate 820 from AND gate 830 when counters 700 and 748 each reach their respective threshold count which in turn respectively sets flip flop 712, and resets flip flop 744 whose QB output is connected on lead 829 to AND gate 830.

The confirmed arc signal on lead 784, FIG. 13, is buffered by a 34072 amplifier 832 and supplied through resistor 834 to LED 836 which is optically coupled to and optically triggers opto-transistor 838 into conduction to conduct current from line 46 through resistor 840 and diode 842 to the gate of SCR 58 to trigger the latter into conduction to conduct current through trip coil 60 and resistor 844, to open breaker contacts 54, FIG. 2. Resistor 846 reduces gate sensitivity and false tripping, and capacitor 848 provides filtering of noise spikes.

The arc timing window circuitry in FIGS. 11–13 is thus responsive to the output of the arc discrimination circuit at node 666, FIG. 12, and generates a confirmed arc signal 810, FIG. 14, on line 784, FIG. 13, in response to a given timing characteristic of the tentative arc signal at node 666. The timing circuitry times the cumulative duration of the tentative arc signal during given timing windows and generates the confirmed arc signal if the cumulative duration reaches given thresholds. Timing windows are initiated by counter timers 700 and 748. Other counter timers 720 and 776 are enabled when the tentative arc signal is present, and disabled when the tentative arc signal is absent, and enabled again when the tentative arc signal reappears, and so on, all within the respective timing windows set by counters 700 and 748, to count the cumulative duration of the tentative arc signal during such timing windows. The circuitry initiates a timing window in response to the tentative arc signal and times the cumulative duration of the tentative arc signal until such cumulative duration reaches a first threshold 736, and then times the cumulative duration of the tentative arc signal during a given portion 752, 770, etc., of the remainder of timing window 706 until the latter cumulative duration 796, 798, 800 reaches a second threshold 808. The confirmed arc signal 810 is generated if the noted second threshold 808 is reached. In the example in FIG. 14, such threshold is not reached during window 752, but it is reached during window 770. The cumulative duration of the tentative arc signal during the noted given portion of the remainder of timing window 706, i.e. the portion of window 706 subsequent to threshold 736, is timed only if the first noted threshold 736 is reached during window 706.

The dual window timing circuitry of FIGS. 11–13 provides a first timing window 706, FIG. 14, during which the cumulative duration of the tentative arc signal is timed, e.g. at 724, 728, and a second conditional timing window 752, 770, etc., during which the cumulative duration of the tentative arc signal is timed, e.g. at 786, 788 and at 796, 798, 800, etc. The second window 752, 770, etc., is conditional upon the cumulative duration of the tentative arc signal 724, 728 reaching a first threshold 736 during the first window 706. The timing circuit generates confirmed arc signal 810 if the cumulative duration of the tentative arc signal 796, 798, 800 during the second window 770 reaches a second threshold 808. The second window is enabled and initiated by the tentative arc signal when the cumulative duration of the tentative arc signal during the first window reaches the first threshold 736. The first and second windows include concurrent portions subsequent to first threshold 736. The cumulative duration of the tentative arc signal in the second window includes only that portion of the cumulative duration of the tentative arc signal in the first window which is subsequent to the first threshold 736. The first window 706 lasts for a first timing interval, e.g. 2 to 3 seconds and times out at the end 716 of such interval. The second window lasts for a second timing interval, e.g. 0.2 second, and times out at the end 754 of such interval.

The circuitry reinitiates the noted second window at 766, FIG. 14, upon reappearance of the tentative arc signal at 768 after the end of the timing interval provided by window 752 if first window 706 has not timed out. Additionally, the circuitry overrides the termination of window 706 otherwise occurring at 716 and instead extends the duration of window 706 if the reinitiated second window 770 has not timed out prior to timing out of first window 706. The circuitry prevents timing out of window 706 until reinitiated second window 770 has timed out.

A first window timer is provided by counter 700, FIG. 11, and is enabled by the tentative arc signal and initiates the first window 706, FIG. 14. A first arc timer is provided by counter 720, FIG. 11, and is enabled by the tentative arc signal and counts the cumulative duration of the tentative arc signal during the first window until such cumulative duration 724, 728 reaches the noted first threshold 736. Arc timer 720 times out at threshold 736. The timing interval of timer 720 is selected to last longer than an arc caused by a switching event in the electric circuit in FIG. 2, such as turning on and off various loads 30 such as lights, appliances, etc., or other switching events. Such switching event is ignored if the cumulative duration of the tentative arc signal caused thereby does not reach the first threshold 736, which is about 0.5 second, during the first window 706, which is about 2 to 3 seconds. A continuing arc subsequent to that which is indicative of a switching event is necessary in order for the cumulative duration 724, 728 of the tentative arc signal to reach the noted first threshold 736.

A second window timer is provided by counter 748, FIG. 12, and is enabled if and when the cumulative duration of the tentative arc signal during the first window 706 reaches the noted first threshold 736, which counter timer 748 then initiates the noted second window 752, which may be reinitiated at 766, etc. A second arc timer is provided by counter 776, FIG. 13, and is enabled by the tentative arc signal upon initiation of the noted second window 752 and counts the cumulative duration of the tentative arc signal during the second window until such cumulative duration reaches the noted second threshold 808. In the example in FIG. 14, cumulative duration 786, 788 does not reach threshold 808 during window 752. Cumulative duration 796, 798, 800 does reach threshold 808 during reinitiated window 770. The timing interval of the second arc timer 776 is selected to last longer than an inconsequential arc in the electric circuit in FIG. 2 such that an inconsequential arc is ignored if the cumulative duration of the tentative arc signal caused thereby does not reach the noted second threshold, as demonstrated by cumulative duration 786, 788 during window 752. The interval chosen for second arc timer 776 in the example in FIG. 14 is 0.05 second, i.e. cumulative duration 796, 798, 800 equals 0.05 second.

The override circuitry includes AND gate 830, FIG. 11, whose input on lead 829 from the QB output of flip flop 744, FIG. 12, will remain low until flip flop 744 is reset by the signal on lead 764 which will not occur until the output of AND gate 756 on line 758 goes high corresponding to counter 748 reaching its given count. Hence, the output of AND gate 830 remains low, and the output of OR gate 820 remains low, preventing reset of flip flops 712 and 734, which overrides the termination of window 706 and extends the duration of such window until timer 748 times out at the end of window 770.

As above noted, resistor 662, FIG. 12, and capacitor 664 provide an initialization circuit holding the tentative arc signal at node 666 low at turn-on. The E field responsive signal on lead 160, the B field responsive signal on lead 228, and the direction indicative signal on lead 652 are ANDed at AND gate 658 with the initialization signal on lead 660 which prevents erroneous signals at turn-on, which may otherwise be present while the analog circuits are powering up and stabilizing out, from starting the digital counters. This hold-off function is accomplished by charging capacitor 664 through resistor 662 upon power up. This holds lead 660 in a low state for an initial period of time controlled by resistor 662 and capacitor 664 and prevents the output of AND gate 658 from going high. Capacitor 812, FIG. 13, and resistor 814 also provide an initialization circuit generating a reset pulse at power up due to the differentiator network provided by capacitor 812 and resistor 814. The reset pulse resets all the flip flops and counters so that everything starts in a known state at power up.

Once the power up sequence is complete, lead 660, FIG. 12, goes high, which in turn enables the output of AND gate 658 at node 666 to go high if each of the E field, B field, and direction signals are high, i.e. coincidence of the E, B, and direction signals causes the output of AND gate 658 to go high for the duration of the coincidence. On the first rising edge of the signal at node 666 and lead 667, the Q output of flip flop 702, FIG. 11, is set high. This enables counter 700 to count at a rate of 100 Hz, provided that the QB output of flip flop 712 is in a high state. When counter 700 reaches its preset count as selected by the bits that are wired into AND gate 708, the output of AND gate 708 will set the Q output of flip flop 712 to a high state, which acts through OR gate 714 to reset counter 700. Counter 700 provides a main or first window timer for the detection function and also resets the switching delay window provided by first arc timer 720. When the tentative arc signal at node 666 and lead 667 goes high and the QB output of flip flop 734 is high, counter 720 starts counting at a rate of 100 Hz. Unlike counter 700 which continuously counts, counter 720 stops counting and holds its value whenever the tentative arc signal at node 666 goes low. When the tentative arc signal at node 666 goes back high, counter 720 will continue counting from the place it left off. If and when counter 720 reaches its preset wired count, the output of AND gate 730 goes high and the Q output of flip flop 734 is set to a high state, and the counter is reset. The purpose of timer 720 is to serve as a relay to account for switching times before a confirmed arc is determined to be present.

Once the Q output of flip flop 734, FIG. 11, has gone high, AND gate 742, FIG. 12, is enabled, which allows the tentative arc signal from node 666 to set the Q output of flip flop 744 to a high state and the QB output of flip flop 744 to a low state. The QB output, in conjunction with AND gate 830, FIG. 11, prevents the resetting of the latches provided by flip flops 712 and 734 when the arc window timing is enabled by the Q output of flip flop 744. Should this event happen, as noted above for the override function extending the duration of window 706 beyond normal time out and reset at 716, the latches provided by flip flops 712 and 734 will be reset following the reset of the second window timer 748. Once enabled by flip flop 744, FIG. 12, counter 748 counts at a rate of 1 KHz. Counter 748 will be reset if the wired count output of AND gate 756 goes high before the output of AND gate 778, FIG. 13, goes high and causes breaker 34 to trip to an open circuit condition. Timer 748 provides a time window during which a predetermined amount of arcing time must be present to trip the breaker.

Once AND gate 742, FIG. 12, has been enabled, counter 776, FIG. 13, will count at 1 KHz any time that the tentative arc signal at node 666 is in a high state. If the accumulated total count in counter 776 forces the output of AND gate 778 high before the output of AND gate 56 goes high as determined by the count selected on counter 748, the Q output of flip flop 782 will be set high and the QB output low. The function of timer 776 is to look for a predetermined amount of arc time within the time window set up by timer 748. If the amount of arc time is not reached, the counters are reset by the pulse from AND gate 756. If, on the other hand, the proper amount of arcing time is reached, the arc confirmed signal 810, FIG. 14, will be generated on lead 784, and breaker 34 will tripped to an open circuit condition. Timer 776 may be combined as a single timer with timer 720, though the present system is preferred because it provides increased resolution in the arc time function and easier implementation.

The clock circuit is provided as above described and times all of the digital counters. The 1 MHz square wave clock output is decade divided to the noted frequencies of 100 KHz, 10 KHz, 1 KHz, and 100 Hz. The two clock frequencies that are used for the timing are the 100 Hz and the 1 KHz rates. The 100 Hz is used to clock timers 700 and 720, while the 1 KHz is used to clock timers 748 and 776. Other clock rates may of course be used.

Each of counters 700, 720, 748, 776 is provided by two individual cascaded counters, with the second counter clocked by the first. Each of the respective inverters 718, 740, 772, 792 takes the falling edge of the most significant bit of the first counter and uses the inversion, or rising edge, to clock the second, or more significant, counter, as is conventional. The counters may also be implemented as single 8 bit counters, or other numbers of bits. Other timers may also be used.

Inverter 828, FIG. 11, and AND gate 826 serve as a reset lockout circuit which functions to prevent a reset of flip flop 744 at the same time that data is present at the set input of flip flop 744. This is done to prevent hanging up of the flip flop.

Flip flop 712, FIG. 11, and inverters 822 and 824 form a reset hold and delay circuit. When timer 700 times out, a pulse is generated for one clock cycle and resets the counter. If, however, the counter is not allowed to reset due to activity in window 770, the reset pulse must be held for use at a later time when the second window timer 748 has reset. This is the function of flip flop 712. Once the reset is allowed to occur, it must be assured that everything is allowed to reset before the reset signal is itself reset. Hence, the function of inverters 822, 824 is to delay the resetting of flip flop 712 which contains the reset signal by the use of propagation delay through these two inverter stages.

Once the Q output of flip flop 782, FIG. 13, is set high, breaker 34 will trip to its open circuit condition. The high signal from the Q output of flip flop 782 is impedance matched by amplifier follower stage 832. This signal then drives the emitter portion of opto-coupler 836, 838 through series resistance 834, such that AC current flows through the detector portion 838 to flow through resistor 840, which current is half wave rectified by diode 842 and fires the gate of SCR 58. Resistor 846 keeps the gate of the SCR in a normally low state to prevent false firing of the SCR. Once fired, the SCR allows AC current to flow from line 46 through latch coil 60 and series limiting resistor 844 and back to neutral conductor 48. This trips breaker 34 and powers down all electronics as they are powered from the load side of the breaker. Opto-isolation is preferred because the electronics are powered by a full wave line derived power supply, to be described, and hence the circuit ground is not at the same potential as neutral. The QB output of flip flop 782 in conjunction with AND gate 760 forms a trip reset lockout circuit which prevents reset of flip flop 782, counter 748, and counter 776 in the event that the trip or confirmed arc signal 810 on lead 784 has been sent. This is done to prevent a reset while the mechanical circuit breaker latch is energized to trip. This eliminates chatter, and ensures that the breaker will trip. At this point, only the tripping of the breaker and subsequent powering down of the electronics will reset flip flop 782 and the confirmed arc signal on lead 784.

Figure 15:
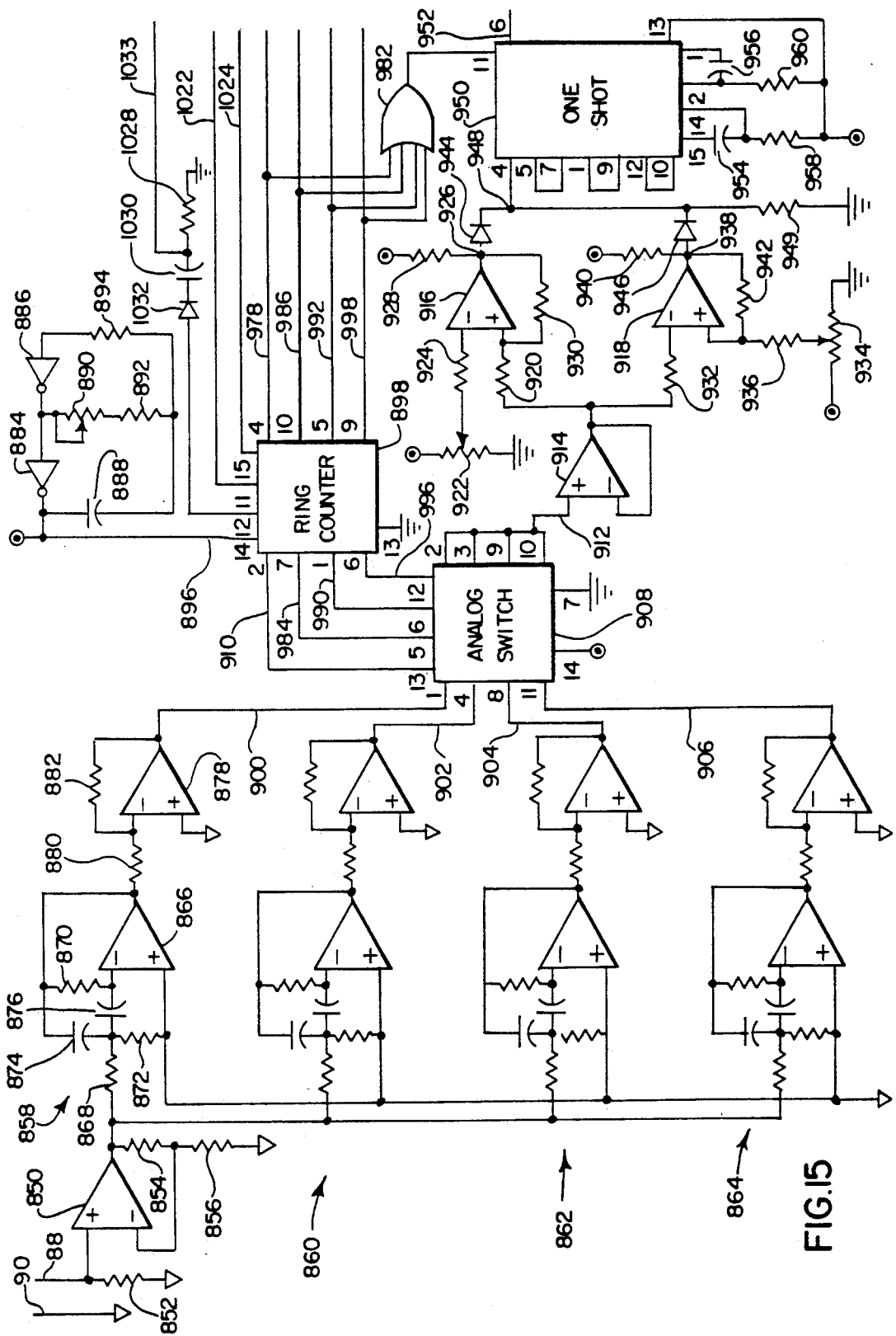
FIGS. 15-16 are a circuit diagram of a multiplexed comb filter circuit.
Figure 16:
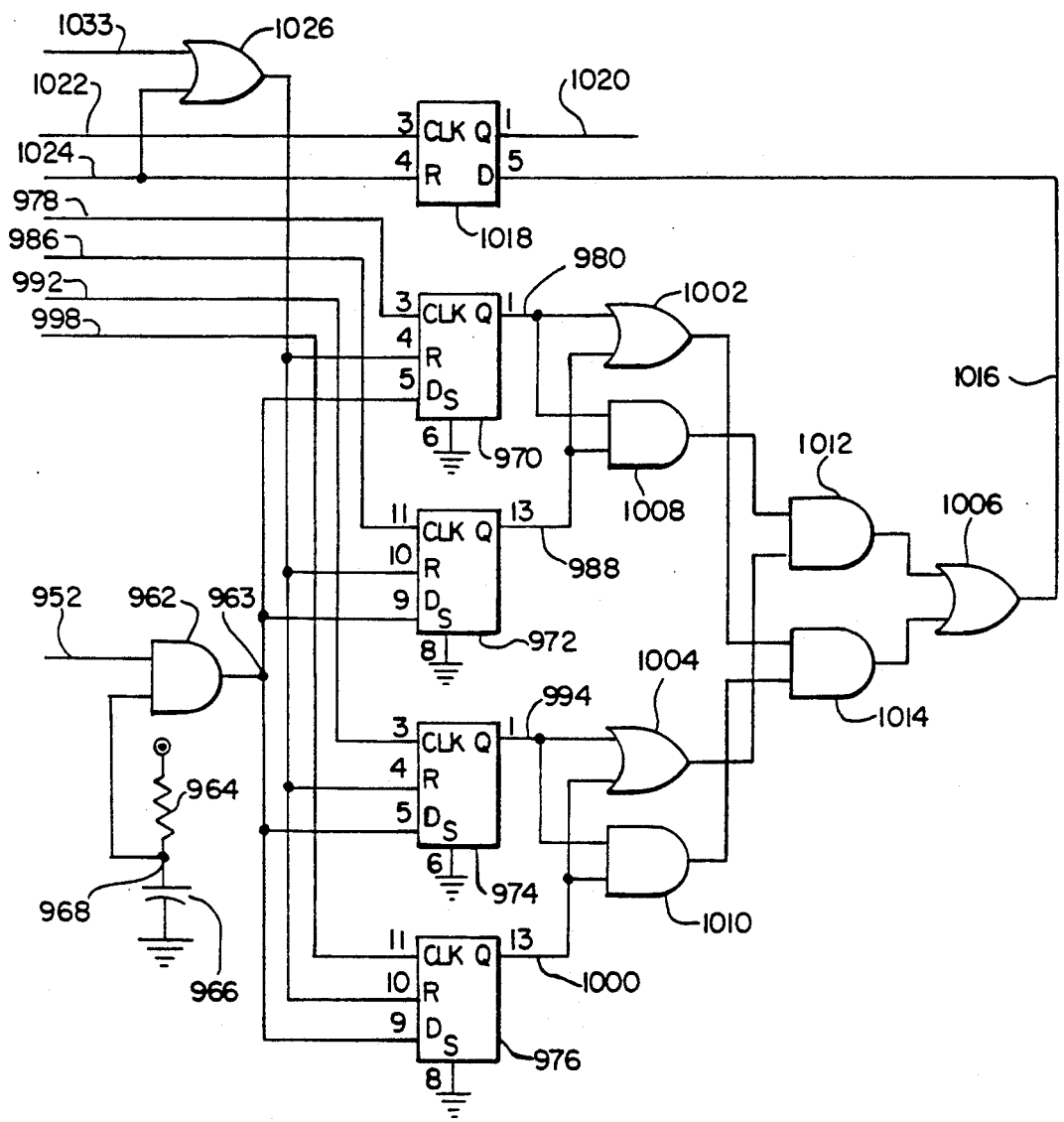

FIGS. 15 and 16 show arc discrimination circuitry including a multiplexed comb filter responsive to E field sensor 66 and generating an arc indicative signal in response to a given frequency signature of the field responsive signal, including field responsive signal frequencies appearing in given combinations of a plurality of passbands. Frequency responsive circuitry responds to the E field sensor and generates an arc indicative signal in response to a given frequency characteristic of the field responsive signal. The method uses spectral decomposition to look for appropriate data in the E field which is indicative of an arc. Comb filtering is preferred, though other types of spectral decomposition can be used. The spectral decomposition, including comb filtering, can also be applied to the B field responsive signal and/or the direction indicative signal.

A 34072 operational amplifier 850, FIG. 15, with its associated resistors 852, 854, 856 provides a high input impedance amplifier connected to lead 88 for amplifying the voltage differential induced across sleeves 72 and 74, FIG. 3, connected to leads 88 and 90. The output of amplifier 850 is provided to a plurality of bandpass filters 858, 860, 862, 864 to look for energy in different frequency bands. Filter 858 has two stages, the first a filter stage, and the second a linear amplification stage. While a single stage may be used, the split into two stages is preferred to allow easier adjustment of the gain level. A 34072 operational amplifier 866, resistor 868, resistor 870, resistor 872, capacitor 874 and capacitor 876 form a bandpass filter with a bandwidth of 50 KHz and a center frequency of 55 KHz. The linear amplification stage is provided by a 34072 operational amplifier 878 and resistors 880 and 882. The remaining filters 860, 862, 864 are comparable and have the same bandwidth as bandpass filter 858 but have center frequencies of 225 KHz, 525 KHz, 825 KHz, respectively.

A square wave clock signal is generated by inverters 884 and 886, capacitor 888, and resistors 890, 892, 894. The frequency of the square wave is selected by adjusting resistor 890, and in the example shown is 100 KHz, which frequency clocks the multiplexing circuitry at lead 896.

A 4017 ring counter 898, FIG. 15, controls the multiplexing. Leads 900, 902, 904, 906 supply the signals from respective bandpass filters 858, 860, 862, 864 to respective input terminals of a 4066 analog switch 908. On the first clock pulse on lead 896 to counter 898, lead 910 goes high which allows the data on lead 900 from bandpass filter 858 to pass through analog switch 908 to output lead 912. This data is then impedance matched in the buffer stage provided by a 34072 operational amplifier 914, after which the data is supplied to a window comparator comparable to the above described window comparators and including a pair of 339 comparators 916 and 918. Amplifier 916 compares the multiplexer output from op amp 914 supplied through resistor 920 against a reference value supplied from Vcc through potentiometer 922 and resistor 924, and outputs a positive signal at node 926 when the multiplexer output signal positively exceeds the noted reference value. Resistor 928 is a pull-up resistor, and resistor 930 provides a small amount of hysteresis on the comparator threshold to help assure clean transitions. Comparator 918 compares the multiplexer output signal from op amp 914 supplied through resistor 932 against a reference value supplied from Vcc through potentiometer 934 and resistor 936, and outputs a positive signal at node 938 when the multiplexer output signal negatively exceeds the noted reference value. Resistor 940 is a pull-up resistor, and resistor 942 provides a small amount of hysteresis on the comparator threshold to help assure clean transitions. The comparator output signals at nodes 926 and 938 are supplied through respective rectifying diodes 944 and 946 and hard wired ORed at node 948, referenced to ground through resistor 949, and supplied to a 4098 monostable multivibrator 950.

Upon receiving a rising pulse edge from node 948, FIG. 15, monostable multivibrator 950 generates a positive pulse on lead 952 of fixed time duration. Monostable multivibrator 950 is programmable according to capacitors 954, 956, and resistors 958, 960. The length of the timed pulse is controlled by capacitor 956 and resistor 960. Reset delay is controlled by capacitor 954 and resistor 958. The pulse from monostable multivibrator 950 is supplied on lead 952 to one input of an AND gate 962, FIG. 16, having its other input connected to an initialization circuit provided by resistor 964 and capacitor 966. At initial turn on of the circuit, capacitor 966 charges through resistor 964 from Vcc, and a low state is presented at node 968, such that the output of AND gate 962 at node 963 is low. After initial turn on of the circuit, capacitor 966 is charged to a sufficient level that a high state is presented at node 968, such that the output of AND gate 962 at node 963 follows the input on lead 952. The pulse on lead 952 thus passes through AND gate 962 and is supplied in parallel to the data inputs of a set of 4013 flip flops 970, 972, 974, 976.

The next clock pulse on lead 896, FIG. 15, causes lead 910 from ring counter 898 to go low, and lead 978 to go high. The high state on lead 978 is supplied to the clock input of flip flop 970, FIG. 16, and clocks the data from node 963 into flip flop 970 such that the data from monostable multivibrator 950, FIG. 15, on lead 952 supplied through AND gate 962 appears on Q output lead 980 of flip flop 970. The high state on lead 978 is also supplied to an OR gate 982, FIG. 15, which resets monostable multivibrator 950. As above noted, the reset delay is controlled by resistor 958 and capacitor 954. The reset is delayed to insure that the data has been clocked into flip flop 970 before monostable multivibrator 950 is reset to remove the pulse from lead 952 and the data input to flip flop 970. The reset is used to insure that the monostable multivibrator has been reset before the next bandpass filter 860 is processed.

The clock signal on lead 896, FIG. 15, continues to clock the ring counter 898 through its counting sequence reading each remaining bandpass filter 860, 862, 864, then repeating the cycle and reading bandpass filter 858, etc., and if the energy in each respective frequency band is high enough, setting the Q output of the respective flip flop 970, 972, 974, 976 to a high state. For example, the third clock pulse on lead 896 causes ring counter output lead 978 to go low and lead 984 to go high which allows the signal on lead 902 from bandpass filter 860 to pass through analog switch 908 to lead 912 and op amp 914, and if such signal positively or negatively exceeds the noted reference values, it will trigger one shot monostable multivibrator 950 to generate an output pulse on lead 952 which is supplied through AND gate 962 and node 963 to the data inputs of flip flops 970, 972, 974, 976. The next clock pulse on lead 896 causes lead 984 to go low and lead 986 to go high which clocks the data into flip flop 972 to appear at its Q output lead 988, and which high state on lead 986 resets monostable multivibrator 950 through OR gate 982. The next clock pulse on lead 896 causes lead 986 to go low and lead 990 to go high which passes the signal on lead 904 from bandpass filter 862 through analog switch 908 and if sufficient will trigger one shot monostable multivibrator 950 to generate an output pulse on lead 952 which is supplied to the data inputs of the flip flops, and upon the next clock pulse on lead 896, lead 990 goes low and lead 992 goes high which clocks the data through flip flop 974 to its Q output at 994, and which high state on lead 992 resets monostable multivibrator 950 through OR gate 982. Upon the next clock pulse on lead 896, lead 992 goes low and lead 996 goes high which allows the signal on lead 906 from bandpass filter 864 to pass through analog switch 908 and if positively or negatively exceeding the noted reference values to trigger monostable multivibrator 950 to generate an output pulse on lead 952 which is presented to the data inputs of the flip flops, and upon the next clock pulse on lead 896, lead 996 goes low and lead 998 goes high which clocks the data through flip flop 976 to its Q output 1000, and which high state on lead 998 resets monostable multivibrator 950 through OR gate 982. As noted, if there is insufficient energy in the respective channel or passband of bandpass filters 858, 860, 862, 864, then the respective Q output 980, 988, 994, 1000 will be low.

The combination of OR gates 1002, 1004, 1006, and 4081 AND gates 1008, 1010, 1012, 1014 provide a logic stage which generates a high state at output lead 1016 if any three out of the four Q output leads 980, 988, 994, 1000 are high. The output signal on lead 1016 is supplied to the data input of 4013 flip flop 1018 and is clocked through flip flop 1018 to its Q output at lead 1020 in response to the ninth clock pulse on lead 896 which causes lead 1022 from ring counter 898 to go high. The flip flops are reset after each set of multiplexed channels receives the clock signal on lead 1024. The resetting clock signal on lead 1024 is supplied directly to flip flop 1018, and is supplied through an OR gate 1026 to flip flops 970, 972, 974, 976. OR gate 1026 also supplies a reset signal to the flip flops upon initial turn on of the circuit due to the initiation circuit provided by resistor 1028, capacitor 1030, and diode 1032 providing an initialization signal on lead 1033 until capacitor 1030 is charged.

The signal on lead 1020 may be used as an arc indicative signal, tentative or confirmed, or may be substituted for the signal on lead 160 in FIG. 11, or may be added as a fifth input to AND gate 658 in FIG. 11 to provide another condition which must be satisfied before the tentative arc signal is generated at node 666.

The frequency discrimination circuitry in FIGS. 15 and 16 provide frequency responsive circuitry responsive to the E field sensor and generating an arc indicative signal in response to a given frequency characteristic of the field responsive signal. The frequency responsive circuitry monitors a plurality of different frequencies of the field responsive signal through bandpass filters 858, 860, 862, 864, and generates an arc indicative signal at output 1020 in response to a given combination of field responsive signal frequencies, for example three out of the four bands, though other combinations and characteristics may be used. The comb filter provided by passband filters 858, 860, 862, 864 has a plurality of passbands and is responsive to the field sensor 66 and generates an arc indicative signal in response to a given frequency signature of the field responsive signal. In the example given, the arc indicative signal is generated in response to field responsive signals appearing in a given combination of the passbands. The comb filter is provided by a plurality of bandpass filters, each receiving the field responsive signal, and the arc discrimination circuit includes a selective logic circuit 1002-1014 choosing a given combination and outputting an arc indicative signal in response thereto. It is preferred that the field responsive signal be multiplexed through a plurality of passbands, for cost efficiency, though dedicated circuitry could otherwise be provided for each channel otherwise multiplexed. The multiplexer includes a plurality of channels, and a plurality of inputs, one for each channel and coupled to a respective bandpass filter output, and having a multiplexer output 912 combining the channels. A plurality of flip flops 970, 972, 974, 976, one for each channel, are connected in parallel and receive the multiplexer output. Ring counter 898 provides a timing circuit clocking the multiplexer to sequentially choose one of the multiplexer inputs and clock same through the multiplexer to the multiplexer output, and also clocking the flip flops to clock a given channel in the multiplexer output through the respective flip flop to the respective flip flop output 980, 988, 994, 1000. Logic gate circuit 1002-1014 is coupled to the outputs of the flip flops and generates the arc indicative signal in response to a designated combination of the flip flop outputs 980, 988, 994, 1000. The window comparator Circuit, including comparators 916 and 918, compares the multiplexer output to first and second reference values, and generates an output when the multiplexer output positively exceeds the first reference value or negatively exceeds the second reference value. One shot monostable multivibrator 950 responds to the window comparator circuit output to generate a timed output pulse on lead 952 to flip flops 970, 972, 974, 976. The timing circuit provided by ring counter 898 also resets one shot monostable multivibrator 950 prior to the next channel in the multiplexer output. Ring counter 898 has a plurality of sequentially clocked outputs, including a first set of outputs on leads 910, 984, 990, 996 coupled to the multiplexer, and a second set of outputs on leads 978, 986, 992, 998 coupled both to one shot monostable multivibrator 950 through OR gate 982 and to flip flops 970, 972, 974, 976, such that ring counter 898 performs the noted clocking function and also resets one shot monostable multivibrator 950 after each output pulse therefrom and prior to the next channel in the multiplexer output.

Figure 17:
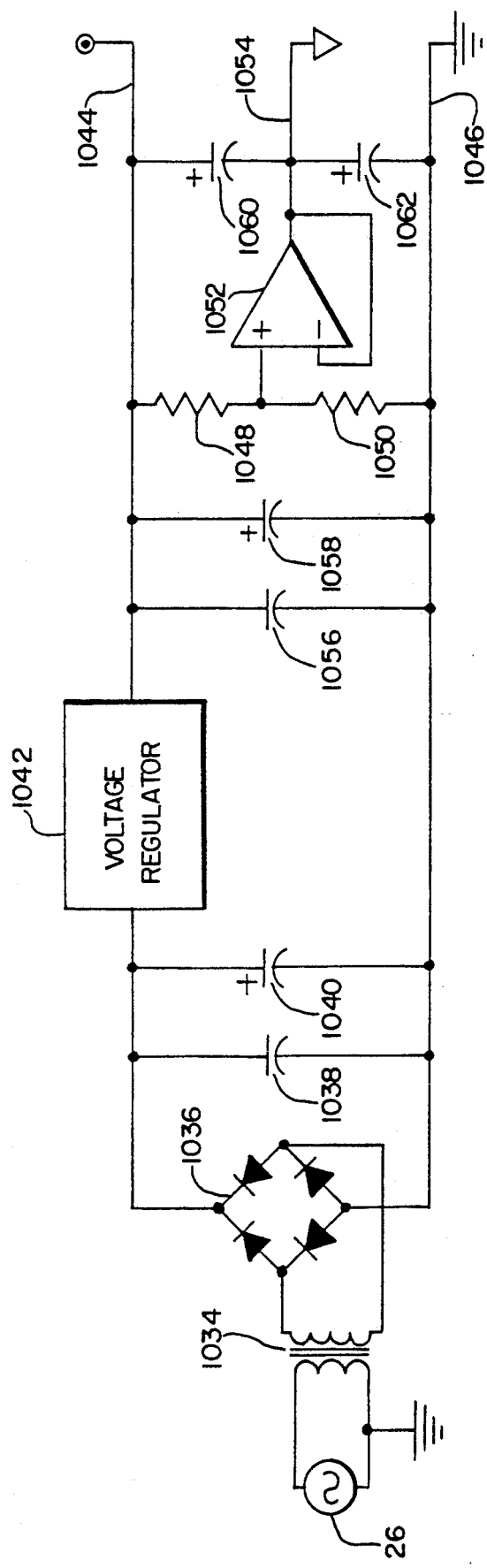
FIG. 17 is a circuit diagram of a power supply.

FIG. 17 shows power supply circuitry. Electrical power from AC source 26 is provided through transformer 1034 and full wave rectifying diode bridge 1036 and is filtered by capacitors 1038 and 1040, and regulated by a 7815 voltage regulator 1042 providing a regulated 15 volt source on lead 1044 relative to lead 1046 which is grounded. The voltage is divided by the voltage divider network provided by resistors 1048 and 1050 and supplied through a buffer stage provided by a 34072 operational amplifier 1052 to provide on lead 1054 a 7.5 volt reference relative to grounded lead 1046. Further smoothing and filtering is provided by capacitors 1056, 1058, 1060, 1062.

As above noted, it is preferred that B field sensor 68, FIG. 3, is a current transformer. It is further preferred that such current transformer and burden resistor 162, FIG. 5, or 416, FIG. 8, be shielded, including from the effects of radiated electric fields. A conductive shield 1064, FIGS. 18 and 19, encloses core 84 and coil 86. The shield is provided by first and second annular copper cups 1066 and 1068 facing each other and defining an enclosed annular space 1070 therebetween. Core 84 and coil 86 are received in annular space 1070. An annular electrical insulation layer 1072 is disposed between cups 1066 and 1068 and prevents a shorted turn through the cups around the core and prevents an eddy current loop. A jumper conductor 1074 electrically connects cup 1066 to cup 1068 without a shorted turn. The jumper conductor is provided by a conductive pin punched or otherwise inserted into apertures through the cups and the insulator therebetween. It is preferred that jumper conductor 1074 electrically connect cups 1066 and 1068 on the same face of each cup, to prevent a shorted turn.

Each cup has a U-shape in cross-section, FIG. 19. Cup 1066 has a bight 1076 extending between a pair of spaced parallel legs 1078 and 1080. Cup 1068 has an inverted U-shape, with a bight 1082 extending between a pair of spaced parallel legs 1084 and 1086. The cups are mated to form space 1070 therebetween defined by upper and lower, FIG. 19, distally opposite sides provided by each respective bight 1082 and 1076, and left and right distally opposite sides provided by the respective legs 1078, 1084 and 1080, 1086. Insulation layer 1072 has a U-shape in cross-section and lines the inside of cup 1066. Cup 1068 is inverted and telescopically received in cup 1066 such that the legs 1078 and 1080 of cup 1066 overlap and extend parallel to the legs 1084 and 1086 of cup 1068, with the insulation layer between the legs of the cups.

Coil 86 has first and second leads 1088 and 1090 connected to respective conductors 94 and 96. Burden resistor 162 has an upper end connected to lead 1088, and a lower end connected to lead 1090. It is preferred that burden resistor 162 have a resistance which is less than or equal to the resistance of wound coil 86. Shield 1064 has a section 1092 enclosing burden resistor 162. Cups 1066 and 1068 are electrically connected at jumper conductor 1074 and are electrically connected to the lower end of burden resistor 162 by conductor 1094. Grounded conductor 1096 grounds the cups and the lower end of burden resistor 162. Conductors 94 and 96 are preferably provided by a coaxial cable, FIG. 18, having an outer electrically insulating sheath 1098 around an electrically conductive conductor sheath providing conductor 96 which is around an electrically insulating sheath 1100 which is around inner conductor 94.

There is thus provided an arc detection system sensing an electromagnetic field established about an electrified conductor by the occurrence of an electrical arc in the electric circuit, and generating a field responsive signal thereto, and discriminatingly responding to the field responsive signal and generating an arc indicative signal in response to a given characteristic of the field responsive signal. Various characteristics and conditions have been disclosed, and others are possible. The sensing transducer is electrically isolated from the conductor. It is preferred that the circuit selectively respond to frequencies within one or more given bands, which preferably, but not necessarily, exclude the excitation frequency of the voltage source 26. The preferred bands are from about 1 KHz to about 5 MHz. The system offers significant advantages in that it senses series arcs along the line conductor, series arcs along the neutral conductor, line to line arcs, line to neutral arcs, and line to ground arcs, all by sensing the electromagnetic field. Alternative E field sensors include a POYNTING vector sensor. Alternative B field sensors include Hall sensors, magnetoresistive sensors, excited core sensors, and POYNTING vector sensors. Alternative direction sensors include POYNTING vector sensors, directional antennas, and patterned waveguides or directional couplers, for example as shown in "Direction Coupler Design Graphs", Alejandro Duenas J., RF Design, February 1986, pages 62-64, and "Directional Couplers", Antonio N. Paolantonio, RF Design, September/October 1979, pages 40-49. In a further alternative, chaos of the direction sensing signal is additionally monitored. It is anticipated that various of the discrete components will be integrated into an application specific integrated circuit during continuing development, in order to facilitate condensed size. The term arc as used herein is defined to include not only a discharge of electricity through a gas or across an insulating medium, but also high impedance faults or other intended or unintended circuit paths which do not have sufficient energy or current flow to jump a gap or trip a breaker, but nevertheless can generate damaging heat or other undesirable effects.

It is recognized that various equivalents, alternatives and modifications are possible within the scope of the appended claims.

We claim:

1. An arc detector for an electric circuit including an electrified conductor connecting a voltage source to a load, said conductor having a line side extending from said arc detector to said voltage source, and a load side extending from said arc detector to said load, said arc detector comprising a field sensor sensing an electromagnetic field established about said conductor by the occurrence of an electrical arc in said electric circuit, and generating a field responsive signal in response thereto, a direction sensing circuit detecting whether said electrical arc is from said load side or said line side and generating a direction indicative signal, an arc discrimination circuit responsive to said field sensor and generating an arc indicative signal in response to a given characteristic of said field responsive signal in combination with a given characteristic of said direction indicative signal, wherein said arc discrimination circuit comprises an AND circuit having a first input coupled to said field sensor, and a second input coupled to said direction sensing circuit, and having an output providing said arc indicative signal only if said arc is from said load side.

2. An arc detector for an electric circuit including an electrified conductor connecting a voltage source to a load, said conductor having a line side extending from said arc detector to said voltage source, and a load side extending from said arc detector to said load, said arc detector comprising a field sensor sensing an electromagnetic field established about said conductor by the occurrence of an electrical arc in said electric circuit, and generating a field responsive signal in response thereto, a direction sensing circuit detecting whether said electrical arc is from said load side or said line side and generating a direction indicative signal, wherein said direction sensing circuit comprises an inductor circuit connected in series between said line side and said load side, and a monitor circuit monitoring the voltage drop across said inductor circuit due to, said electrical arc wherein said voltage source has a predetermined excitation frequency, and comprising a high pass circuit coupled to said inductor circuit and said monitor circuit and selectively responding to frequencies higher than said predetermined excitation frequency, such that said monitor circuit monitors the voltage drop across said inductor circuit due to said electrical arc at frequencies higher than said predetermined excitation frequency.

3. An arc detector for an electric circuit including an electrified conductor connecting a voltage source to a load, said conductor having a line side extending from said arc detector to said voltage source, and a load side extending from said arc detector to said load, said arc detector comprising a field sensor sensing an electromagnetic field established about said conductor by the occurrence of an electrical arc in said electric circuit, and generating a field responsive signal in response thereto, a direction sensing circuit detecting whether said electrical arc is from said load side or said line side and generating a direction indicative signal, wherein said direction sensing circuit comprises an inductor circuit connected in series between said line side and said load side, and a monitor circuit monitoring the voltage drop across said inductor circuit due to, said electrical arc wherein said monitor circuit comprises a comparator circuit comparing the voltage at the line side of said inductor circuit against the voltage at the load side of said inductor circuit, and providing a load direction indicative signal if the voltage at the load side of said inductor circuit is higher than the voltage at the line of said inductor circuit, and providing a line direction indicative signal if the voltage at the load side of said inductor circuit is lower than the voltage at the line side of said inductor circuit.

4. An arc detector for an electric circuit including an electrified conductor connecting a voltage source to a load, said conductor having a line side extending from said arc detector to said voltage source, and a load side extending from said arc detector to said load, said arc detector comprising a field sensor sensing an electromagnetic field established about said conductor by the occurrence of an electrical arc in said electric circuit, and generating a field responsive signal in response thereto, a direction sensing circuit detecting whether said electrical arc is from said load side or said line side and generating a direction indicative signal, wherein said direction sensing circuit comprises an inductor circuit connected in series between said line side and said load side, and a monitor circuit monitoring the voltage drop across said inductor circuit due to, said electrical arc wherein said voltage source has a predetermined excitation frequency, and comprising a first capacitor coupled to said inductor circuit at the line side thereof, and a second capacitor coupled to said inductor circuit at the load side thereof, said first capacitor and said inductor circuit forming in combination a first filter attenuating propagation of signals from said load side through said inductor circuit at frequencies higher than said predetermined excitation frequency, said second capacitor and said inductor circuit forming in combination a second filter attenuating propagation of signals from said line side through said inductor circuit at frequencies higher than said predetermined excitation frequency.

5. The arc detector according to claim 4 comprising a frequency selective circuit comprising third and fourth capacitors, said third capacitor being coupled to the line side of said inductor circuit and to said first capacitor and passing said higher frequencies and blocking said predetermined excitation frequency, said fourth capacitor being coupled to the load side of said inductor circuit and to said second capacitor and passing said higher frequencies and blocking said predetermined excitation frequency.

6. The arc detector according to claim 5, comprising a first resistor connected in series with said third capacitor and forming an RC filter therewith, a second resistor connected in series with said fourth capacitor and forming an RC filter therewith, a fifth capacitor charged through said third capacitor and a third resistor, a sixth capacitor charged through said fourth capacitor and a fourth resistor, a fifth resistor coupled to said fifth capacitor for discharging said fifth capacitor, said fifth resistor having a higher resistance value than said third resistor such that said fifth capacitor discharges at a slower rate than it charges, a sixth resistor coupled to said sixth capacitor for discharging said sixth capacitor, said sixth resistor having a higher resistance value than said fourth resistor such that said sixth capacitor discharges at a slower rate than it charges, a comparator having a first input coupled to said sixth capacitor, a second input coupled to said fifth capacitor, and an output providing said direction indicative signal, and comprising first and second rectifying diodes, and wherein said fifth capacitor is charged to a DC level through said third capacitor, said first rectifying diode and said third resistor, and wherein said sixth capacitor is charged to a DC level through said fourth capacitor, said second rectifying diode, and said fourth resistor.

7. An arc detector for an electric circuit including an electrified conductor connecting a voltage source to a load, said conductor having a line side extending from said arc detector to said voltage source, and a load side extending from said arc detector to said load, said arc detector comprising a field sensor sensing an electromagnetic field established about said conductor by the occurrence of an electrical arc in said electric circuit, and generating a field responsive signal in response thereto, a direction sensing circuit detecting whether said electrical arc is from said load side or said line side and generating a direction indicative signal, wherein said field sensor comprises an E field sensor sensing an E field established about said conductor by the occurrence of an electrical arc in said electric circuit, wherein said field sensor further comprises in combination a B field sensor sensing a B field established about said conductor by the occurrence of an electrical arc in said electric circuit, wherein said field sensor further comprises in combination a B field sensor sensing a B field established about said conductor by the occurrence of an electrical arc in said electric circuit and generating a B field responsive signal, and comprising an arc discrimination circuit responsive to said E field sensor and to said B field sensor and to said direction sensing circuit and generating an arc indicative signal in response to a given characteristic of said E field responsive signal in combination with a given characteristic of said B field responsive signal and in further combination with a given characteristic of said direction indicative signal.

8. An arc detector for an electric circuit including an electrified conductor connecting a voltage source to a load, said conductor having a line side extending from said arc detector to said voltage source, and a load side extending from said arc detector to said load, said arc detector comprising a field sensor sensing an electromagnetic field established about said conductor by the occurrence of an electrical arc in said electric circuit, and generating a field responsive signal in response thereto, a direction sensing circuit detecting whether said electrical arc is from said load side or said line side and generating a direction indicative signal, an arc discrimination circuit responsive to said field sensor and generating an arc indicative signal in response to a given characteristic of said field responsive signal in combination with a given characteristic of said direction indicative signal, wherein said given characteristic of said field responsive signal is a random chaotic pattern of said field responsive signal.

9. The arc detector according to claim 8 wherein said arc discrimination circuit comprises a dual differentiate circuit differentiating said field responsive signal twice with respect to time to provide the second derivative of said field responsive signal for monitoring said random chaotic pattern of said field responsive signal to provide said arc indicative signal.

10. The arc detector according to claim 9 wherein said field sensor comprises an E field sensor sensing the E field established about said conductor by the occurrence of an electrical arc in said electric circuit and generating an E field responsive signal, and a B field sensor sensing a B field established about said conductor by the occurrence of an electrical arc in said electric circuit and generating a B field responsive signal, and wherein said arc discrimination circuit comprises a first dual differentiate circuit differentiating said E field responsive signal twice with respect to time to provide a second derivative of said E field responsive signal, a second dual differentiate circuit differentiating said B field responsive signal twice with respect to time to provide the second derivative of said B field responsive signal, such that said given characteristic of said field responsive signal is a random chaotic pattern of both said E field responsive signal and said B field responsive signal.

11. The arc detector according to claim 10 comprising an AND circuit having a first input from said first dual differentiate circuit, a second input from said second dual differentiate circuit, and a third input from said direction sensing circuit, and having an output providing said arc indicative signal.

12. An arc detector for an electrical current distribution circuit including a load center having a line side receiving electrical power from a voltage source of redetermined excitation frequency, and a load side distributing said electrical power to at least one load, said load center having at least one electro-responsive circuit breaker, and an electrified conductor coupling said voltage source through said load center and said circuit breaker to said load, said arc detector comprising a field sensor sensing an electromagnetic field established about said conductor y the occurrence of n electrical arc in said distribution circuit, and generating a field responsive signal in response thereto, a direction sensing circuit detecting whether said electrical arc is from said load side or said line side of said load center, a trip circuit responsive to said direction sensing circuit and tipping said circuit beaker to an open circuit condition if said arc is from said load side of said load center, and leaving said circuit breaker in a closed circuit condition if said arc is from said line side of said load center, wherein said direction sensing circuit comprises an inductor circuit connected in series between said line side and said load side, and a monitor circuit monitoring the voltage drop across said inductor circuit due to said arc, and comprising a frequency selective circuit coupled to said inductor circuit and said monitor circuit and selectively responding to frequencies higher than said predetermined excitation frequency, such that said monitor circuit monitors the voltage drop across pair a inductor circuit due to said electrical are at said higher frequencies, said monitor circuit comprising a comparator circuit comparing the voltage at the line side of said inductor circuit against the voltage at the load side of said inductor circuit at said higher frequencies, and triggering said trip circuit to trip said circuit breaker to said open circuit condition if the voltage at the load side of said inductor circuit is higher than the voltage at the line side of said inductor circuit at said higher frequencies, and leaving said circuit breaker in said closed circuit condition if the voltage at the load side of said inductor circuit is lower than the voltage at the line side of said inductor circuit at said higher frequencies, and comprising a first capacitor coupled to said inductor circuit at the line side thereof, and a second capacitor coupled to said inductor circuit at the load side thereof, said first capacitor and said inductor circuit forming in combination a first filter attenuating propagation of signals from said load side through said inductor circuit at frequencies higher than said predetermined excitation frequency, said second capacitor and said inductor circuit forming in combination a second filter attenuating propagation of signals from said line side through said inductor circuit at frequencies higher than said predetermined excitation frequency, and wherein said frequency selective circuit comprises third and fourth capacitors, said third capacitor being coupled to the line side of said inductor circuit and to said first capacitor and passing said higher frequencies and blocking said predetermined excitation frequency, said fourth capacitor being coupled to the load side of said inductor circuit and to said second capacitor and passing said higher frequencies and blocking said predetermined excitation frequency.

13. An arc detection method for an electric circuit including an electrified conductor connecting a voltage source to a load, said conductor having a line side extending from said voltage source, and a load side extending from said load, said arc detection method comprising sensing an electromagnetic field established about said conductor by the occurrence of an electrical arc in said electric circuit, and generating a field responsive signal in response thereof, detecting whether said arc is from said load side or said line side, and generating a direction indicative signal, discriminatingly responding to said field responsive signal and generating an arc indicative signal in response to a designed combination of a given characteristic of said field responsive signal and a given characteristic of said direction indicative signal, ANDing said field responsive signal and said direction indicative signal and providing said arc indicative signal only if said electrical arc is from said load side.

14. An arc detecting method for n electric circuit including an electrified conductor connecting a voltage source to a load, said conductor having a line side extending from said voltage source, and a load side extending from said load, said arc detection method comprising sensing an electromagnetic field established about said conductor by the occurrence of an electrical arc in said electric circuit, and generating a field responsive signal in response thereof, detecting whether said arc is from said load side or said line side, and generating a direction indicative signal, sensing an E field established about said conductor by the occurrence of an electrical arc in said electric circuit and generating an E field responsive signal, also sensing a B field established about said conductor by the occurrence of an electrical arc in said electric circuit and generating a B field responsive signal, discriminatingly responding to said E field responsive signal and to said B field responsive signal and to said direction indicative signal and generating an arc indicative signal in response to a given characteristic of said E field responsive signal in combination with a given characteristic of said B field responsive signal and further in combination with a given characteristic of said direction indicative signal.

15. An arc detection method for an electric circuit including an electrified conductor connecting a voltage source to a load, said conductor having a line side extending from said voltage source, and a load side extending from said load, said arc detection method comprising sensing an electromagnetic field established about said conductor by the occurrence of an electrical arc in said electric circuit, and generating a field responsive signal in response thereof, detecting whether said arc is from said load side or said line side, and generating a direction indicative signal, discriminatingly responding to said field responsive signal and generating an arc indicative signal in response to a designated combination of a given characteristic of said field responsive signal and a given characteristic of said direction indicative signal, generating said arc indicative signal in response to a random chaotic pattern of said field responsive signal.

16. The method according to claim 15, comprising differentiating said field responsive signal twice with respect to time to provide a second derivative of said field responsive signal for monitoring said random chaotic pattern of said field responsive signal to provide said arc indicative signal.

17. The method according to claim 16 comprising sensing the E field established about said conductor by the occurrence of an electrical arc in said electric circuit and generating an E field responsive signal, sensing the B field established about said conductor by the occurrence of an electrical arc in said electric circuit and generating a B field responsive signal, differentiating said E field responsive signal twice with respect to time to provide a second derivative of said E field responsive signal, differentiating said B field responsive signal twice with respect to time to provide a second derivative of said B field responsive signal, such that said given characteristic of said field responsive signal is a random chaotic pattern of both said E field responsive signal and said B field responsive signal.

18. The method according to claim 17 comprising ANDing said second derivative of said E field responsive signal and said second derivative of said B field responsive signal and said direction indicative signal to provide said arc indicative signal.

* * * * *

UNITED STATES PATENT AND TRADEMARK OFFICE
CERTIFICATE OF CORRECTION

PATENT NO. : 5,185,686
DATED : February 9, 1993
INVENTOR(S) : JAMES E. HANSEN ET AL Page 1 of 2

It is certified that error appears in the above-identified patent and that said Letters Patent is hereby corrected as shown below:

Claim 2, col. 27, line 53, after "to" delete ","; Claim 2, col. 27, line 54, after "arc" insert -- , --; Claim 3, col. 28, line 9, after "to" delete ","; Claim 3, col. 28, line 10, after "arc" insert -- , --; Claim 4, col. 28, line 35, after "to" delete ","; Claim 4, col. 28, line 36, after "arc" insert -- , --; Claim 6, col. 28, line 60, after "5" delete ","; Claim 9, col. 29, line 66, delete "differentiate" and substitute therefor -- differentiator --; Claim 10, col. 30, line 13, delete "differentiate" and substitute therefor -- differentiator --; Claim 10, col. 30, line 16, delete "differentiate" and substitute therefor -- differentiator --; Claim 11, col. 30, line 25, delete "differentiate" and substitute therefor -- differentiator --; Claim 11,

UNITED STATES PATENT AND TRADEMARK OFFICE
CERTIFICATE OF CORRECTION

PATENT NO. : 5,185,686
DATED : February 9, 1993
INVENTOR(S) : JAMES E. HANSEN ET AL It is certified that error appears in the above-identified patent and that said Letters Patent is hereby corrected as shown below:

col. 30, line 26, delete "differentiate" and substitute therefor -- differentiator --; Claim 12, col. 30, line 32, delete "redetermined" and substitute therefor -- predetermined --; Claim 12, col. 30, line 39, delete "y" and substitute therefor -- by --; Claim 12, col. 30, line 39, delete "n" and substitute therefor -- an --; Claim 12, col. 30, line 57, after "across" delete "pair a" and substitute therefor -- said --; Claim 12, col. 30, line 58, delete "are" and substitute therefor -- arc --; Claim 14, col. 31, line 43, delete "detecting" and substitute therefor -- detection --; Claim 14, col. 31, line 43, after "for" delete "n" and substitute therefor -- an --; Claim 16, col. 32, line 30, after "15" delete ",".

Signed and Sealed this

Twenty-ninth Day of March, 1994

*Attest:*

BRUCE LEHMAN

*Attesting Officer*   Commissioner of Patents and Trademarks